(12) United States Patent
Kamiyama

(10) Patent No.: US 8,569,804 B2
(45) Date of Patent: Oct. 29, 2013

(54) LIGHT RECEIVING DEVICE

(75) Inventor: Tomoyuki Kamiyama, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 13/435,496

(22) Filed: Mar. 30, 2012

(65) Prior Publication Data

US 2012/0248505 A1    Oct. 4, 2012

(30) Foreign Application Priority Data

Mar. 31, 2011    (JP) .................................. 2011-081329

(51) Int. Cl.
*H01L 31/112*    (2006.01)

(52) U.S. Cl.
USPC ........................................................ 257/222

(58) Field of Classification Search
USPC .............. 257/222, 216, 215, 213; 438/68, 75, 438/144
See application file for complete search history.

(56) References Cited

U.S. PATENT DOCUMENTS

| | | | |
|---|---|---|---|
| 5,804,868 A * | 9/1998 | Kobayashi et al. ............ | 257/630 |
| 7,910,964 B2 * | 3/2011 | Kawahito et al. ............. | 257/292 |
| 8,284,282 B2 * | 10/2012 | Oike .............................. | 348/294 |
| 2008/0042047 A1 | 2/2008 | Nam et al. | |
| 2009/0230437 A1 | 9/2009 | Kawahito et al. | |
| 2009/0251582 A1 | 10/2009 | Oike | |
| 2009/0303362 A1 | 12/2009 | Ebihara | |
| 2010/0231891 A1 | 9/2010 | Mase et al. | |
| 2011/0157354 A1 | 6/2011 | Kawahito | |

FOREIGN PATENT DOCUMENTS

| | | |
|---|---|---|
| JP | 2009-268083 A | 11/2009 |
| JP | 2009-296400 A | 12/2009 |
| JP | 2010-32425 A | 2/2010 |
| JP | 2010-268079 A | 11/2010 |
| WO | WO2007/026777 A1 | 3/2007 |

OTHER PUBLICATIONS

Ryohei Miyagawa et al, "Integration-Time Based Computational Image Sensors," ITE Technical Report vol. 19, No. 65, Nov. 1995, pp. 37-41.
Ryohei Miyagawa et al, "CCD-Based Range-Finding Sensor," IEEE Transactions on Electron Devices, vol. 44, No. 10, Oct. 1997, pp. 1648-1652.
Non-Final Office Action dated Jul. 12, 2013 in corresponding U.S. Appl. No. 13/435,368.

* cited by examiner

*Primary Examiner* — Telly Green
*Assistant Examiner* — Damon Hillman
(74) *Attorney, Agent, or Firm* — Squire Sanders (US) LLP

(57) ABSTRACT

A light receiving device comprises a photoelectric conversion element formed on a first-conductivity-type semiconductor substrate, and further comprises a plurality of photoelectron distributors formed on the first-conductivity-type semiconductor substrate. The photoelectron distributor has a first transfer unit for transferring photoelectrons generated in the photoelectric conversion element, a photoelectron hold unit for temporarily holding the photoelectrons generated in the photoelectric conversion element, a second transfer unit for transferring the photoelectrons held in the photoelectron hold unit, and a floating diffusion layer for storing the transferred photoelectrons and converting the photoelectrons to a voltage. A first-conductivity-type impurity region, which has a first-level, first-conductivity-type impurity concentration higher than the first-conductivity-type impurity concentration of the first-conductivity-type semiconductor substrate, is formed in the vicinity of a surface of the first-conductivity-type semiconductor substrate in the photoelectron hold unit.

8 Claims, 18 Drawing Sheets

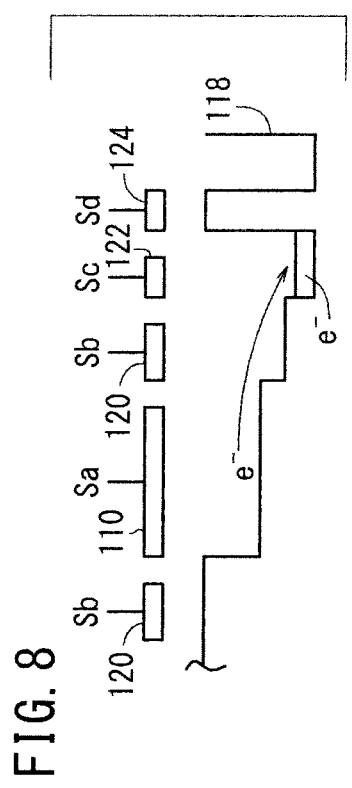

LIGHT RECEIVING DEVICE

CROSS-REFERENCE TO RELATED APPLICATION

This application is based upon and claims the benefit of priority from Japanese Patent Application No. 2011-081329 filed on Mar. 31, 2011, of which the contents are incorporated herein by reference.

BACKGROUND OF THE INVENTION

1. Field of the Invention

The present invention relates to a light receiving device for allocating and storing photoelectrons generated by photoelectric conversion.

2. Description of the Related Art

Known conventional applications of image sensors include technologies using a time-of-flight (TOF) method for measuring a distance to a target object in a contactless manner. In one known technology using the TOF method, photoelectrons (negative electric charge) generated in a photoelectric conversion element are allocated and then read out. In Ryohei Miyagawa and Takeo Kanade, "*CCD-Based Range-Finding Sensor*", *IEEE Transactions on Electron Devices*, Vol. 44, No. 10, October 1997, pp. 1648-1652 and Ryohei Miyagawa and Takeo Kanade, *ITE Technical*, Vol. 19, No. 65, pp. 37-41 (November 1995), a pulsed light is emitted from a light-emitting device in an emission period and is not emitted therefrom in an emission stop period, the light-emitting device is driven to repeat the emission period and the emission stop period with the same time length at a duty ratio of 50%, the pulsed light is detected in synchronism with the periods, and thus generated photoelectrons are distributed in two directions. In addition, in Japanese Laid-Open Patent Publication No. 2010-032425, the photoelectrons generated in the photoelectric conversion element are distributed in four directions.

SUMMARY OF THE INVENTION

However, photoelectrons, which are generated by the photoelectric conversion in a period other than light-receiving periods, are contained deep inside a semiconductor substrate having the photoelectric conversion element, and then are introduced by thermal diffusion or the like into a surface of the substrate (e.g. the photoelectric conversion element or a photoelectron hold unit), so that the photoelectrons act as noises and deteriorate the light-receiving accuracy.

Accordingly, in view of the above conventional problem, an object of the present invention is to provide a light receiving device capable of preventing the photoelectrons existing deep inside the semiconductor substrate from being introduced into the substrate surface by the thermal diffusion.

To achieve the above object, according to one aspect of the present invention, there is provided a light receiving device comprising a photoelectric conversion element for detecting a light to generate photoelectrons formed on a first-conductivity-type semiconductor substrate, wherein the light receiving device further comprises a plurality of photoelectron distributors formed on the first-conductivity-type semiconductor substrate, each of the photoelectron distributors has a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, and a floating diffusion layer located on one side of the photoelectron hold unit with the second transfer unit interposed therebetween for converting the transferred photoelectrons to a voltage, and a first-conductivity-type impurity region is formed in the vicinity of a surface of the first-conductivity-type semiconductor substrate in the photoelectron hold unit and has a first-level, first-conductivity-type impurity concentration higher than the first-conductivity-type impurity concentration of the first-conductivity-type semiconductor substrate.

A second-conductivity-type impurity region may be formed adjacent to the first-conductivity-type impurity region between a first transfer gate of the first transfer unit and a hold gate of the photoelectron hold unit and/or between the hold gate of the photoelectron hold unit and a second transfer gate of the second transfer unit in the vicinity of the surface of the first-conductivity-type semiconductor substrate.

The first-conductivity-type impurity region may extend in a depth direction more than the second-conductivity-type impurity region formed between the first transfer gate of the first transfer unit and the hold gate of the photoelectron hold unit and/or between the hold gate of the photoelectron hold unit and the second transfer gate of the second transfer unit, and may further extend beneath the second-conductivity-type impurity region.

A first-conductivity-type impurity layer may be formed as an intermediate layer in the first-conductivity-type semiconductor substrate and may have a second-level, first-conductivity-type impurity concentration higher than the first-conductivity-type impurity concentration of the first-conductivity-type semiconductor substrate.

A first-conductivity-type impurity layer may be formed as an intermediate layer in the first-conductivity-type semiconductor substrate, and the first-conductivity-type impurity concentration of the first-conductivity-type impurity layer may decrease in a direction toward the surface of the first-conductivity-type semiconductor substrate.

To achieve the above object, according to another aspect of the present invention, there is provided a light receiving device comprising a photoelectric conversion element for detecting a light to generate photoelectrons formed on a first-conductivity-type semiconductor substrate, wherein the light receiving device further comprises a plurality of photoelectron distributors formed on the first-conductivity-type semiconductor substrate, each of the photoelectron distributors has a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, and a floating diffusion layer located on one side of the photoelectron hold unit with the second transfer unit interposed therebetween for storing the transferred photoelectrons and converting the photoelectrons to a voltage, and a second-conductivity-type impurity region is formed in the vicinity of a surface of the first-conductivity-type semiconductor substrate.

A first-conductivity-type impurity layer may be formed as an intermediate layer in the first-conductivity-type semiconductor substrate and may have a fourth-level, first-conductivity-type impurity concentration higher than the first-conductivity-type impurity concentration of the first-conductivity-type semiconductor substrate.

A first-conductivity-type impurity layer may be formed as an intermediate layer in the first-conductivity-type semiconductor substrate, and the first-conductivity-type impurity concentration of the first-conductivity-type impurity layer may decrease in a direction toward the substrate surface.

The photoelectric conversion element may have a photogate structure, and the first transfer unit, the photoelectron hold unit, and the second transfer unit may have an MOS diode structure.

In the one aspect of the present invention, the light receiving device comprises the photoelectric conversion element for detecting the light to generate the photoelectrons formed on the first-conductivity-type semiconductor substrate, the light receiving device further comprises a plurality of the photoelectron distributors formed on the substrate, each of the photoelectron distributors has the first transfer unit for transferring the photoelectrons generated in the photoelectric conversion element, the photoelectron hold unit located on one side of the photoelectric conversion element with the first transfer unit interposed therebetween for temporarily holding the photoelectrons generated in the photoelectric conversion element, the second transfer unit located on one side of the first transfer unit with the photoelectron hold unit interposed therebetween for transferring the photoelectrons held in the photoelectron hold unit, and the floating diffusion layer located on one side of the photoelectron hold unit with the second transfer unit interposed therebetween for converting the transferred photoelectrons to the voltage, and the first-conductivity-type impurity region is formed in the vicinity of the substrate surface in the photoelectron hold unit and has the first-level, first-conductivity-type impurity concentration higher than the first-conductivity-type impurity concentration of the substrate. Therefore, an electric field is generated in the photoelectron hold unit by a built-in potential due to the concentration difference, to prevent the photoelectrons in the substrate from being thermally diffused toward the photoelectron hold unit. Thus, the photoelectrons deep inside the substrate can be prevented from being introduced into the photoelectron hold unit by the thermal diffusion, whereby the light-receiving accuracy can be improved. In addition, a depletion layer formed in the photoelectron hold unit does not extend deep into the substrate. Consequently, it is possible to prevent the penetration of the photoelectrons generated in the photoelectric conversion element into the photoelectron hold unit without passing through the first transfer unit.

When the second-conductivity-type impurity region is formed adjacent to the first-conductivity-type impurity region between the first transfer gate of the first transfer unit and the hold gate of the photoelectron hold unit and/or between the hold gate of the photoelectron hold unit and the second transfer gate of the second transfer unit in the vicinity of the surface of the first-conductivity-type semiconductor substrate, the potential level between the first transfer gate and the hold gate and/or between the hold gate and the second transfer gate is lowered to improve the photoelectron transfer speed from the photoelectric conversion element to the photoelectron hold unit and the photoelectron transfer speed from the photoelectron hold unit to the floating diffusion layer.

When the first-conductivity-type impurity layer is formed as the intermediate layer in the first-conductivity-type semiconductor substrate and has the second-level, first-conductivity-type impurity concentration higher than the first-conductivity-type impurity concentration of the substrate, an electric field is generated in the substrate by a built-in potential due to the concentration difference, to prevent the photoelectrons in the substrate from being thermally diffused toward the substrate surface. Thus, the photoelectrons deep inside the substrate can be prevented from being introduced into the substrate surface by the thermal diffusion, whereby the light-receiving accuracy can be improved.

When the first-conductivity-type impurity layer is formed as the intermediate layer in the first-conductivity-type semiconductor substrate, and the first-conductivity-type impurity concentration of the first-conductivity-type impurity layer decreases in the direction toward the substrate surface, an electric field is generated in the substrate by a built-in potential due to the concentration difference, to prevent the photoelectrons in the substrate from being thermally diffused toward the substrate surface. Thus, the photoelectrons deep inside the substrate can be prevented from being introduced into the substrate surface by the thermal diffusion, whereby the light-receiving accuracy can be improved. In addition, the potential level decreases in the direction toward the substrate surface, so that the photoelectrons in the area between the intermediate layer and the substrate surface can be readily collected in the vicinity of the substrate surface. Consequently, the photoelectrons generated in the area between the intermediate layer and the substrate surface in the light-receiving periods can be readily collected in the substrate surface, and it is possible to prevent the penetration of the residual photoelectrons generated deep inside the substrate in periods other than the light-receiving periods.

In the other aspect of the present invention, the light receiving device comprises the photoelectric conversion element for detecting the light to generate the photoelectrons formed on the first-conductivity-type semiconductor substrate, the light receiving device further comprises a plurality of the photoelectron distributors formed on the substrate, each of the photoelectron distributors has the first transfer unit for transferring the photoelectrons generated in the photoelectric conversion element, the photoelectron hold unit located on one side of the photoelectric conversion element with the first transfer unit interposed therebetween for temporarily holding the photoelectrons generated in the photoelectric conversion element, the second transfer unit located on one side of the first transfer unit with the photoelectron hold unit interposed therebetween for transferring the photoelectrons held in the photoelectron hold unit, and the floating diffusion layer located on one side of the photoelectron hold unit with the second transfer unit interposed therebetween for storing the transferred photoelectrons and converting the photoelectrons to the voltage, and the second-conductivity-type impurity region is formed in the vicinity of a surface of the substrate. Therefore, the photoelectrons can be stored inside the substrate, the generation of the photoelectrons unusable as a signal can be prevented, and the noise generation probability can be reduced.

When the first-conductivity-type impurity layer is formed as the intermediate layer in the first-conductivity-type semiconductor substrate and has the fourth-level, first-conductivity-type impurity concentration higher than the first-conductivity-type impurity concentration of the substrate, an electric field is generated in the substrate by a built-in potential due to the concentration difference, to prevent the photoelectrons in the substrate from being thermally diffused toward the substrate surface. Thus, the photoelectrons deep inside the substrate can be prevented from being introduced into the substrate surface by the thermal diffusion, whereby the light-receiving accuracy can be improved. In addition, a depletion layer formed in the substrate does not extend deep into the substrate. Consequently, it is possible to prevent the penetration of the photoelectrons generated in the photoelectric conversion element into the photoelectron hold unit without passing through the first transfer unit.

When the first-conductivity-type impurity layer is formed as the intermediate layer in the first-conductivity-type semiconductor substrate, and the first-conductivity-type impurity concentration of the first-conductivity-type impurity layer decreases in the direction toward the substrate surface, an electric field is generated in the substrate by a built-in potential due to the concentration difference, to prevent the photoelectrons in the substrate from being thermally diffused toward the substrate surface. Thus, the photoelectrons deep inside the substrate can be prevented from being introduced into the substrate surface by the thermal diffusion, whereby the light-receiving accuracy can be improved. In addition, the potential level decreases in the direction toward the substrate surface, so that the photoelectrons in the area between the intermediate layer and the substrate surface can be readily collected in the vicinity of the surface. Consequently, the photoelectrons generated in the area between the intermediate layer and the substrate surface in the light-receiving periods can be readily collected in the substrate surface, and it is possible to prevent the penetration of the residual photoelectrons generated deep inside the substrate in periods other than the light-receiving periods.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 8 is a potential diagram of the photoelectric conversion element, the first transfer unit, the photoelectron hold unit, and the second transfer unit showing a photoelectron transfer state according to another example;

DESCRIPTION OF THE PREFERRED EMBODIMENTS

Figure 1:
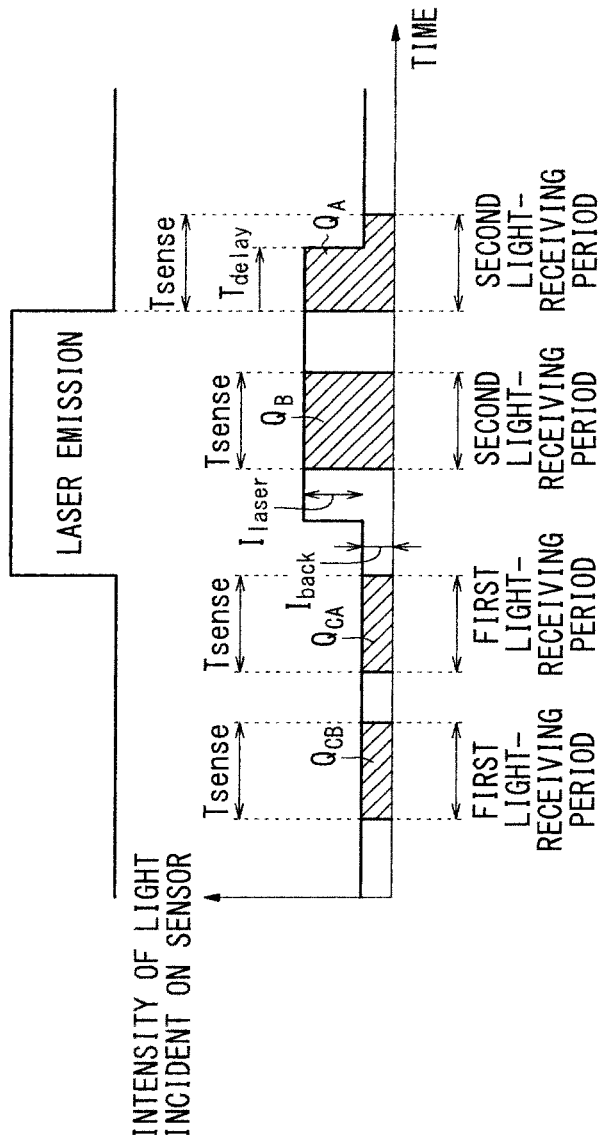
FIG. 1 is a view for illustrating the TOF principle.

A unit pixel, a solid-state image sensing device using the unit pixel, and a unit pixel signal summing method according to a preferred embodiment of the present invention will be described in detail below with reference to the accompanying drawings.

First, an example of the TOF principle will be briefly described with reference to FIG. 1. In first light-receiving periods, an irradiation unit (not shown) does not emit a light such as a laser light to an object, and a pixel array containing a plurality of unit pixels (not shown) receives only an ambient light for a certain time ($T_{sense}$). In the light receiving device, photoelectrons (negative electric charge) are generated via photoelectric conversion of the incident light in the first light-receiving periods, and then are introduced into a photoelectron hold unit in the unit pixel. This example includes two first light-receiving periods, and the photoelectrons generated by the photoelectric conversion in each first light-receiving period are introduced into the photoelectron hold unit in the unit pixel. $Q_{CB}$ represents the quantity of the light incident on the unit pixel in the former first light-receiving period, and $Q_{CA}$ represents the quantity of the light incident on the unit pixel in the latter first light-receiving period. The term "light-receiving period" means a period in which photoelectrons are generated by an incident light and stored (storage period).

All or part of second light-receiving periods overlaps with the period in which the pixel array is exposed to a reflected light of the light emitted from the irradiation unit. In the light receiving device, photoelectrons are generated via the photoelectric conversion of the incident lights also in the second light-receiving periods, and then are introduced into the photoelectron hold unit in the unit pixel. In this example, in the former second light-receiving period, the irradiation unit constantly emits the light, and the unit pixel constantly receives and converts the ambient light and the reflected light of the light emitted from the irradiation unit for the certain time ($T_{sense}$). In the latter second light-receiving period, the unit pixel receives and converts the lights for the certain time ($T_{sense}$) after the light emission from the irradiation unit is stopped. $Q_B$ represents the quantity of the lights incident on the unit pixel in the former second light-receiving period, and $Q_A$ represents the quantity of the lights incident on the unit pixel in the latter second light-receiving period. $I_{laser}$ represents the intensity of the reflected light of the emitted light, and $I_{back}$ represents the intensity of the ambient light.

Thus, the relations of $Q_A-Q_{CA} \propto I_{laser} \times T_{delay}$ and $Q_B-Q_{CB} \propto I_{laser} \times T_{sense}$ are satisfied, in which $T_{delay}$ represents the time elapsed until the emitted light is reflected by the object and returns.

The above relations can be converted to the expression of $T_{delay}=T_{sense} \times (Q_A-Q_{CA})/(Q_B-Q_{CB})$. Therefore, the distance Z to the object can be obtained using the expression of $Z=c \times T_{delay}/2=c \times T_{sense} \times (Q_A-Q_{CA})/2(Q_B-Q_{CB})$, in which c represents the light speed.

Figure 2:
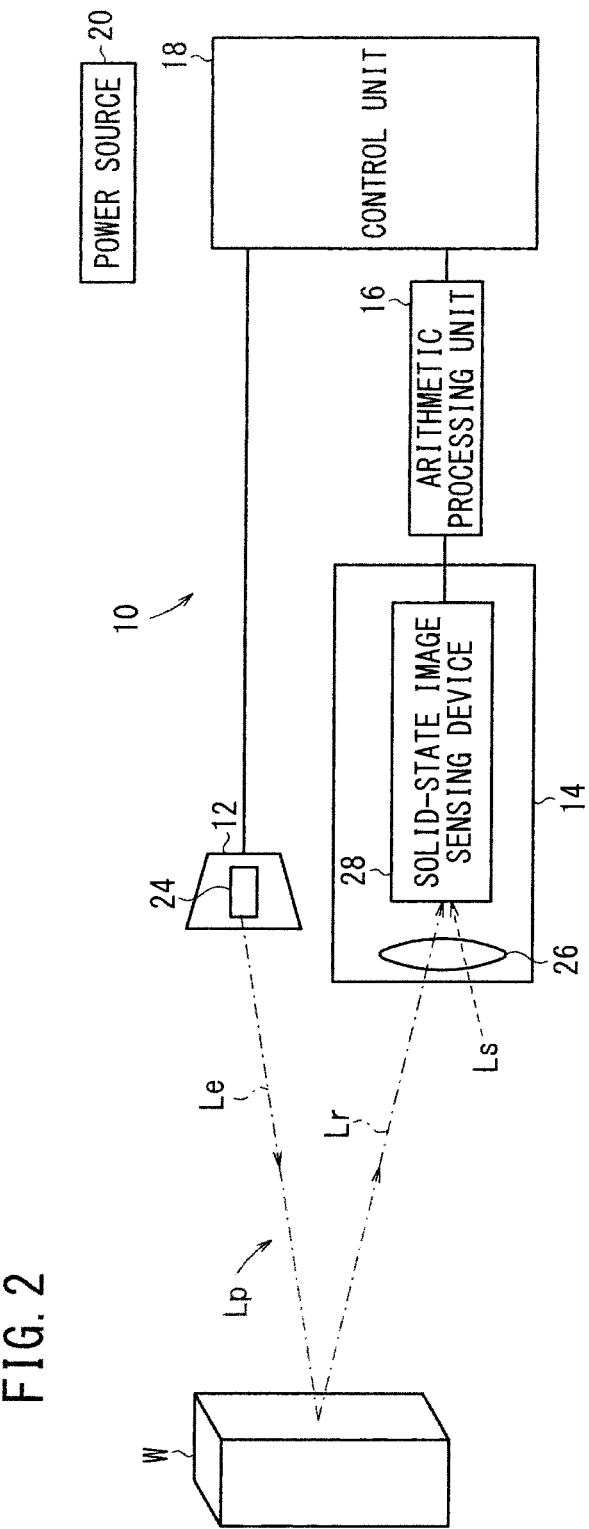
FIG. 2 is a schematic structural view of a distance measuring using a solid-state image sensing device according to an embodiment.

FIG. 2 is a schematic structural view of a distance measuring system 10 using a solid-state image sensing device according to the embodiment. As shown in FIG. 2, the distance measuring system 10 has an irradiation unit 12, an image capturing unit 14, an arithmetic processing unit 16, a control unit 18, and a power source 20.

The power source 20 is for supplying a predetermined power-supply voltage to each portion of the distance measuring system 10. For the sake of brevity, power source lines extending from the power source 20 to the units are omitted in FIG. 2.

The irradiation unit 12 acts to emit a pulsed light Lp to a target object W, and has a light emitter 24 that outputs the pulsed light Lp under control of the control unit 18. In the distance measuring system 10, the light emitter 24 in the irradiation unit 12 may be formed such that semiconductor laser bars having linearly arranged light-emitting spots (emitters) are stacked (connected in series) to perform surface emission.

The light emitter 24 emits an infrared light. For example, the light emitter 24 can emit an infrared light having a wavelength of 870 nanometers (nm) at an output level of 100 watts (W). The light emitter 24 emits the pulsed light Lp with an output time (pulse duration) of 100 nanoseconds.

The light emitter 24 may have a plurality of light-emitting spots arranged in a linear array or a matrix. Another light-emitting device such as a laser diode or a light-emitting diode (LED) may be used as the light emitter 24.

In the distance measuring system 10, the pulsed light Lp emitted from the irradiation unit 12 is reflected by the target object W and then incident on the image capturing unit 14. For illustrative purposes, the pulsed light Lp between the irradiation unit 12 and the target object W is referred to as the emitted light Le, and the pulsed light Lp between the target object W and the image capturing unit 14 is referred to as the reflected light Lr.

The image capturing unit 14 has a lens 26 and a solid-state image sensing device 28. The reflected light Lr and the ambient light Ls pass through the lens 26, and are collected and detected in the solid-state image sensing device 28. The solid-state image sensing device 28 is sensitive to the ambient light Ls and the pulsed light Lp emitted from the irradiation unit 12. In the arithmetic processing unit 16, the distance to the target object W is calculated in the manner described for FIG. 1 based on the information on the number of the photoelectrons stored in the solid-state image sensing device 28 in the light-receiving periods.

Figure 3:
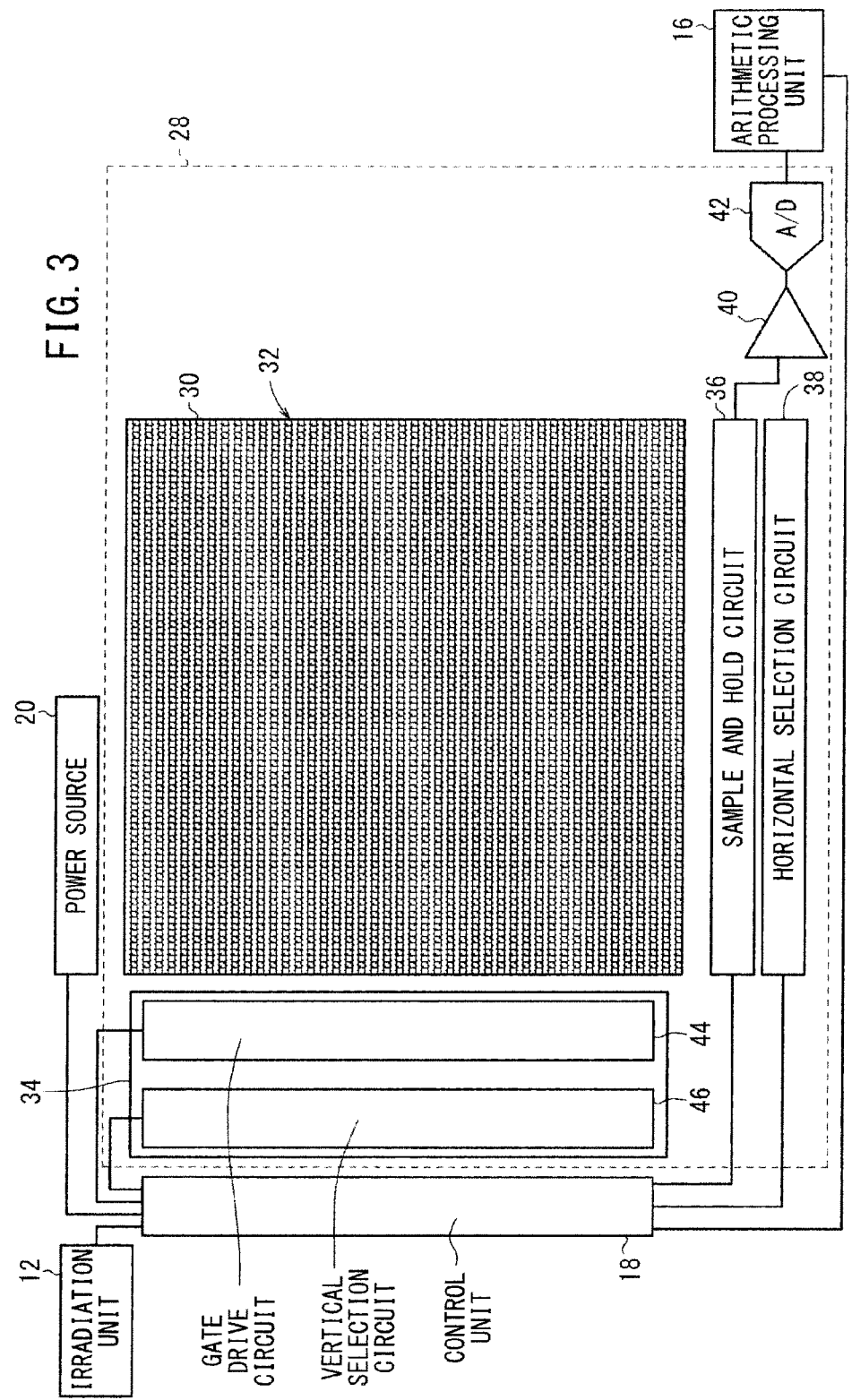
FIG. 3 is a structural view of the solid-state image sensing device.

FIG. 3 is a structural view of the solid-state image sensing device 28. The solid-state image sensing device 28 has a pixel array 32 containing a matrix of unit pixels 30, pixel drive circuits (light receiving device drivers or pixel drivers) 34, a sample and hold circuit 36, a horizontal selection circuit 38, an output buffer 40, and an A/D converter 42.

The power source 20 applies a positive power-supply voltage Vdd and a resetting voltage Vref to the pixel array 32. The pixel drive circuits 34 have a gate drive circuit 44 and a vertical selection circuit 46. The gate drive circuit 44 outputs various gate drive signals to store, hold, transfer, and discharge the photoelectrons in each unit pixel 30 in the pixel array 32. The vertical selection circuit 46 has a multiplexer (not shown), selects a row containing a unit pixel 30 to be read, and makes the unit pixel 30 output a voltage signal (pixel signal) corresponding to the photoelectrons held. The horizontal selection circuit 38 has another multiplexer (not shown) and selects a column containing the unit pixel 30 to be read. The read pixel signal is held in the sample and hold circuit 36 and then output through the output buffer 40 and the A/D converter 42 to the arithmetic processing unit 16. The control unit 18 and the arithmetic processing unit 16 may be formed on the solid-state image sensing device 28.

Figure 4:
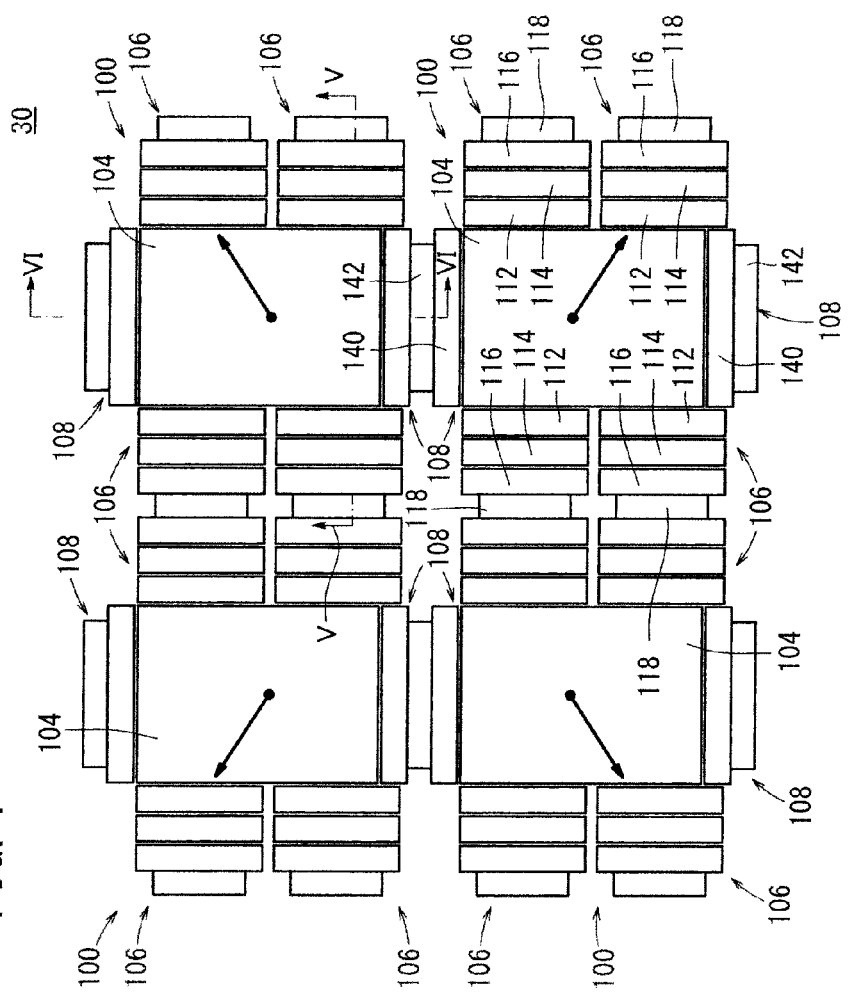
FIG. 4 is a plan view of one unit pixel in the solid-state image sensing device of FIG. 3.
Figure 5:
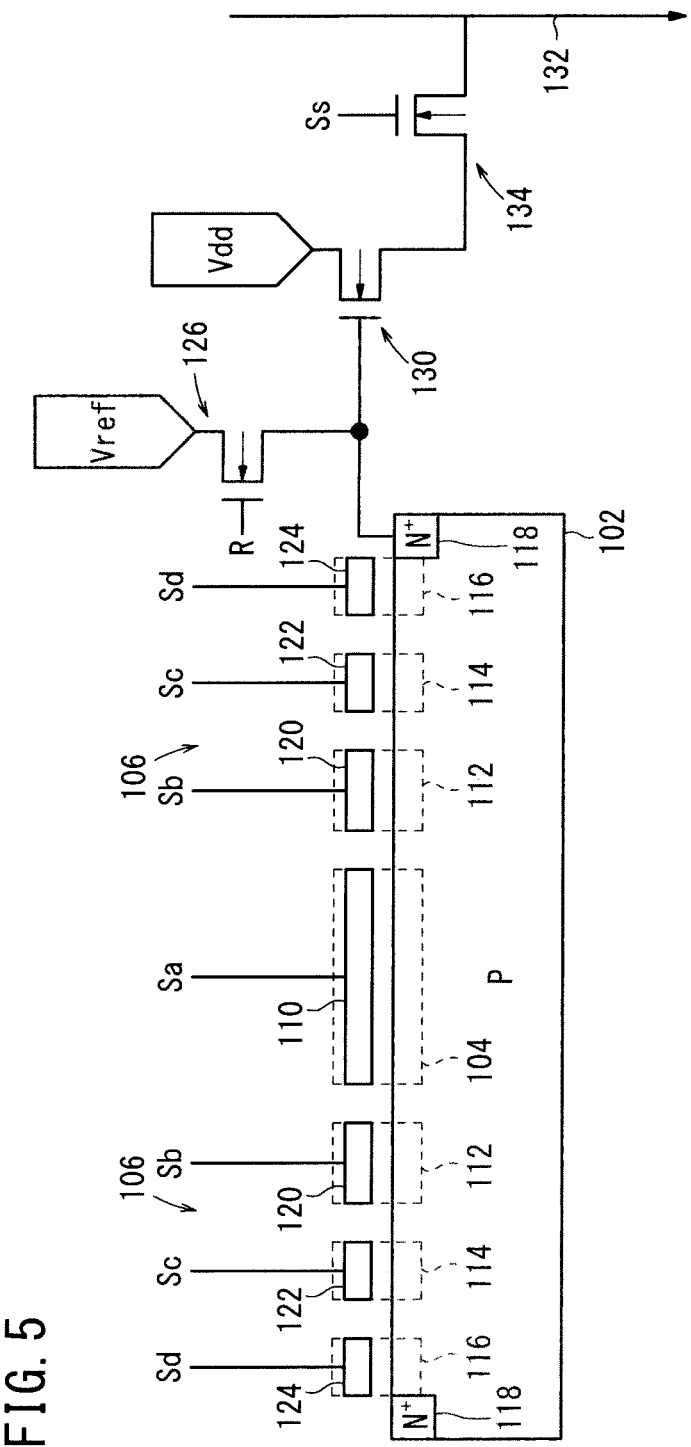
FIG. 5 is a cross-sectional view taken along the line V-V in the direction of the arrows in FIG. 4.
Figure 6:
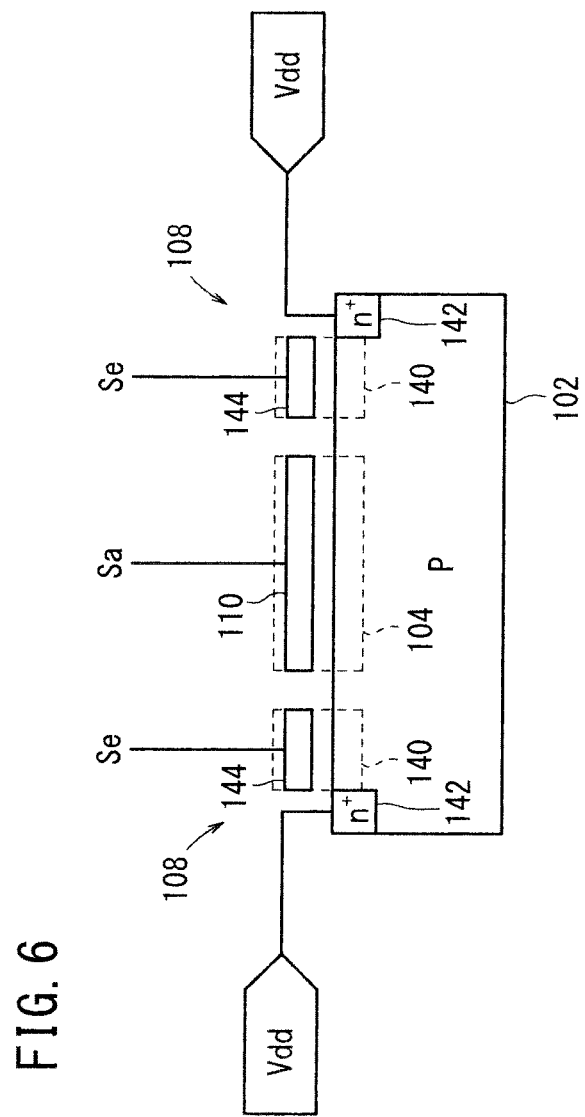
FIG. 6 is a cross-sectional view taken along the line VI-VI in the direction of the arrows in FIG. 4.

FIG. 4 is a plan view of one unit pixel 30 in the solid-state image sensing device 28 of FIG. 3. The unit pixel 30 has a plurality of light receiving devices 100. In this embodiment, the unit pixel 30 has four light receiving devices 100 arranged in a matrix. FIGS. 5 and 6 are cross-sectional views of the light receiving device 100 of FIG. 4. More specifically, FIG. 5 is a cross-sectional view taken along the line V-V in the direction of the arrows in FIG. 4, and FIG. 6 is a cross-sectional view taken along the line VI-VI in the direction of the arrows in FIG. 4.

The unit pixel 30 has the four light receiving devices 100 arranged in a matrix. The light receiving device 100 has a p-type (first-conductivity-type) semiconductor substrate 102, and thereon a photoelectric conversion element 104, four photoelectron distributors 106, and two photoelectron dischargers 108. The photoelectric conversion element 104 has a photogate structure containing an electrode (hereinafter referred to as photogate) 110, which is formed on the p-type semiconductor substrate 102 with an insulator (not shown) interposed therebetween. The photoelectric conversion element 104 is a photodiode capable of detecting a light and generating photoelectrons or negative electric charge (converting the detected light to the photoelectrons). A gate signal Sa for driving the photoelectric conversion element 104 is applied to the photogate 110 by the gate drive circuit 44.

The photoelectron distributor 106 has a first transfer unit 112, a photoelectron hold unit 114, a second transfer unit 116, and a floating diffusion layer 118. The first transfer unit 112 has an MOS diode structure containing an electrode (first transfer gate) 120, which is formed on the p-type semiconductor substrate 102 with the insulator interposed therebetween, for allocating and transferring the photoelectrons generated in the photoelectric conversion element 104 to the photoelectron hold unit 114 (see FIG. 5). A gate signal Sb for driving the first transfer unit 112 is input from the gate drive circuit 44 to the first transfer gate 120. The photoelectron hold unit 114 is located on one side of the photoelectric conversion element 104 with the first transfer unit 112 interposed therebetween and has an MOS diode structure containing an electrode (hold gate) 122, which is formed on the p-type semiconductor substrate 102 with the insulator interposed therebetween, for temporarily collecting and holding the photoelectrons generated in the photoelectric conversion element 104 (see FIG. 5). A gate signal Sc for driving the photoelectron hold unit 114 is applied from the gate drive circuit 44 to the hold gate 122.

The second transfer unit 116 is located on one side of the first transfer unit 112 with the photoelectron hold unit 114 interposed therebetween and has an MOS diode structure containing an electrode (second transfer gate) 124, which is formed on the p-type semiconductor substrate 102 with the insulator interposed therebetween, for transferring the photoelectrons stored in the photoelectron hold unit 114 (see FIG. 5). A gate signal Sd for driving the second transfer unit 116 is applied from the gate drive circuit 44 to the second transfer gate 124. The floating diffusion (FD) layer 118 is located on one side of the photoelectron hold unit 114 with the second transfer unit 116 interposed therebetween for taking in the photoelectrons transferred from the photoelectron hold unit 114 and converting the photoelectrons to a voltage. The floating diffusion layer 118 is formed such that an n-type (second-conductivity-type) impurity is disposed on the p-type semiconductor substrate 102.

As shown in FIG. 4, in one light receiving device 100, each two of the four photoelectron distributors 106 are arranged in the horizontal direction (the right-left direction) symmetrically with respect to the photoelectric conversion element 104. Thus, two of the four photoelectron distributors 106 are arranged vertically on each of the right and left sides of the photoelectric conversion element 104. In one unit pixel 30, the light receiving devices 100 adjacent to each other in the horizontal direction share two floating diffusion layers 118 formed therebetween. Thus, some of the floating diffusion layers 118 are shared by a plurality of light receiving devices 100.

As shown in FIG. 5, the floating diffusion layer 118 is connected to a reset transistor 126 for resetting the potential of the floating diffusion layer 118 to a reference potential. The floating diffusion layer 118 is connected to the source of the reset transistor 126, the resetting voltage Vref is applied from the power source 20 to the drain, and a resetting signal R is supplied from the gate drive circuit 44 to the gate. When a high resetting signal R is supplied to the gate of the reset transistor 126, the reset transistor 126 is turned on to reset the potential of the floating diffusion layer 118 to the reference potential.

Further, the floating diffusion layer 118 is connected to a signal read transistor 130 for reading a voltage signal corresponding to the photoelectrons stored in the floating diffusion layer 118. The signal read transistor 130 is connected to a selection transistor 134 for selecting whether the voltage signal read by the signal read transistor 130 is output or not to a signal read line 132. The power-supply voltage Vdd is applied from the power source 20 to the drain of the signal read transistor 130, the gate is connected to the floating diffusion layer 118, and the source is connected to the drain of the selection transistor 134. When a high selection signal Ss is supplied from the vertical selection circuit 46 to the selection transistor 134, the selection transistor 134 is turned on to read from the signal read line 132 a voltage corresponding to the photoelectrons stored in the floating diffusion layer 118. The source of the selection transistor 134 is connected to the signal read line 132.

The photoelectron discharger 108 has a third transfer unit 140 and a diffusion layer 142. The third transfer unit 140 has an MOS diode structure containing an electrode (third transfer gate) 144, which is formed on the p-type semiconductor substrate 102 with the insulator interposed therebetween, for transferring the photoelectrons generated in the photoelectric conversion element 104 to the diffusion layer 142 (see FIG. 6).

The diffusion layer 142 is located on one side of the photoelectric conversion element 104 with the third transfer unit 140 interposed therebetween. The power-supply voltage Vdd is applied from the power source 20 to the diffusion layer 142.

When a discharge signal Se is input from the gate drive circuit 44 to the third transfer gate 144, the photoelectrons generated in the photoelectric conversion element 104 are discharged from the diffusion layer 142 through the third transfer unit 140.

As shown in FIG. 4, in one light receiving device 100, the two photoelectron dischargers 108 are arranged in the vertical direction (the up-down direction) symmetrically with respect to the photoelectric conversion element 104. In one unit pixel 30, the light receiving devices 100 adjacent to each other in the vertical direction share the diffusion layer 142 formed therebetween. Thus, some of the diffusion layers 142 are shared by the light receiving devices 100.

Figure 7A:
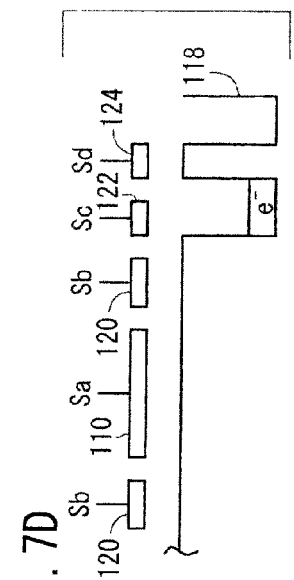
FIG. 7A is a potential diagram of a photoelectric conversion element, a first transfer unit, a photoelectron hold unit, and a second transfer unit in the process of generating photoelectrons in the photoelectric conversion element.
Figure 7D:
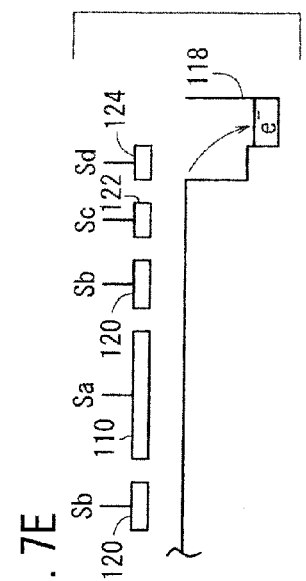
FIG. 7D is a potential diagram of the photoelectric conversion element, the first transfer unit, the photoelectron hold unit, and the second transfer unit in the process of holding the photoelectrons in the photoelectron hold unit.
Figure 7B:
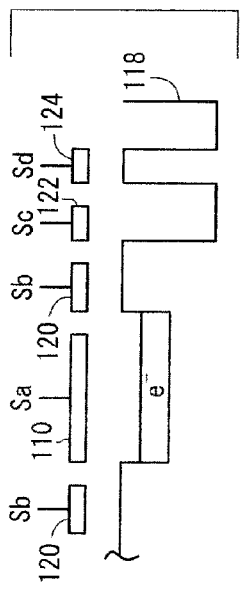
FIGS. 7B and 7C are potential diagrams of the photoelectric conversion element, the first transfer unit, the photoelectron hold unit, and the second transfer unit in the process of transferring the photoelectrons generated in the photoelectric conversion element to the photoelectron hold unit.
Figure 7E:
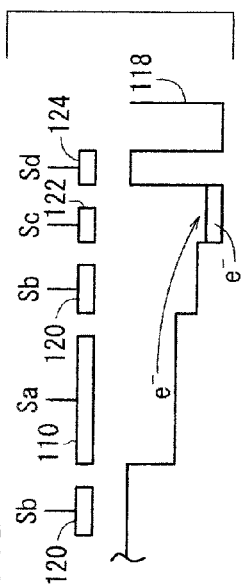
FIG. 7E is a potential diagram of the photoelectric conversion element, the first transfer unit, the photoelectron hold unit, and the second transfer unit in the process of transferring the photoelectrons held in the photoelectron hold unit to a floating diffusion layer.
Figure 7C:
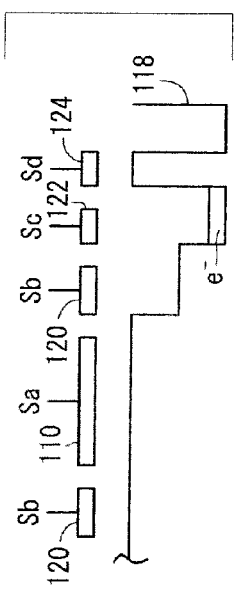

FIG. 7A is a potential diagram of the photoelectric conversion element 104, the first transfer unit 112, the photoelectron hold unit 114, and the second transfer unit 116 in the process of generating the photoelectrons in the photoelectric conversion element 104, FIGS. 7B and 7C are potential diagrams thereof in the process of transferring the photoelectrons generated in the photoelectric conversion element 104 to the photoelectron hold unit 114, FIG. 7D is a potential diagram thereof in the process of holding the photoelectrons in the photoelectron hold unit 114, and FIG. 7E is a potential diagram thereof in the process of transferring the photoelectrons held in the photoelectron hold unit 114 to the floating diffusion layer 118.

As shown in FIG. 7A, a high gate signal Sa is input to the photogate 110 to lower the potential level of the photoelectric conversion element 104, whereby the generated photoelectrons $e^-$ are stored in the photoelectric conversion element 104. Next, as shown in FIG. 7B, a high gate signal Sb is input to the first transfer gate 120, whereby the photoelectrons $e^-$ generated in the photoelectric conversion element 104 are transferred to the photoelectron hold unit 114. In this process, a high gate signal Sc is input to the hold gate 122. Furthermore, as shown in FIG. 7C, a low gate signal Sa is input to the photogate 110 to increase the potential level of the photoelectric conversion element 104, whereby all photoelectrons $e^-$ generated in the photoelectric conversion element 104 are transferred to the photoelectron hold unit 114. Then, as shown in FIG. 7D, a low gate signal Sb is input to the first transfer gate 120, whereby the photoelectrons generated in the photoelectric conversion element 104 are held in the photoelectron hold unit 114. The processes shown in FIGS. 7A to 7C are repeated, so that the photoelectrons generated in the photoelectric conversion element 104 in the multiple light-receiving periods can be held in the photoelectron hold unit 114.

Then, as shown in FIG. 7E, a high gate signal Sd is input to the second transfer gate 124 to lower the potential level of the second transfer unit 116, and a low gate signal Sc is input to the hold gate 122 to increase the potential level of the photoelectron hold unit 114, whereby the photoelectrons $e^-$ held in the photoelectron hold unit 114 are transferred to the floating diffusion layer 118.

As shown in FIG. 8, the high gate signal Sb may be input to the first transfer gate 120 also in the light-receiving process. In this case, the light-receiving process and the photoelectron transfer process of the photoelectrons generated in the photoelectric conversion element 104 can be carried out at the same time.

Figure 9:
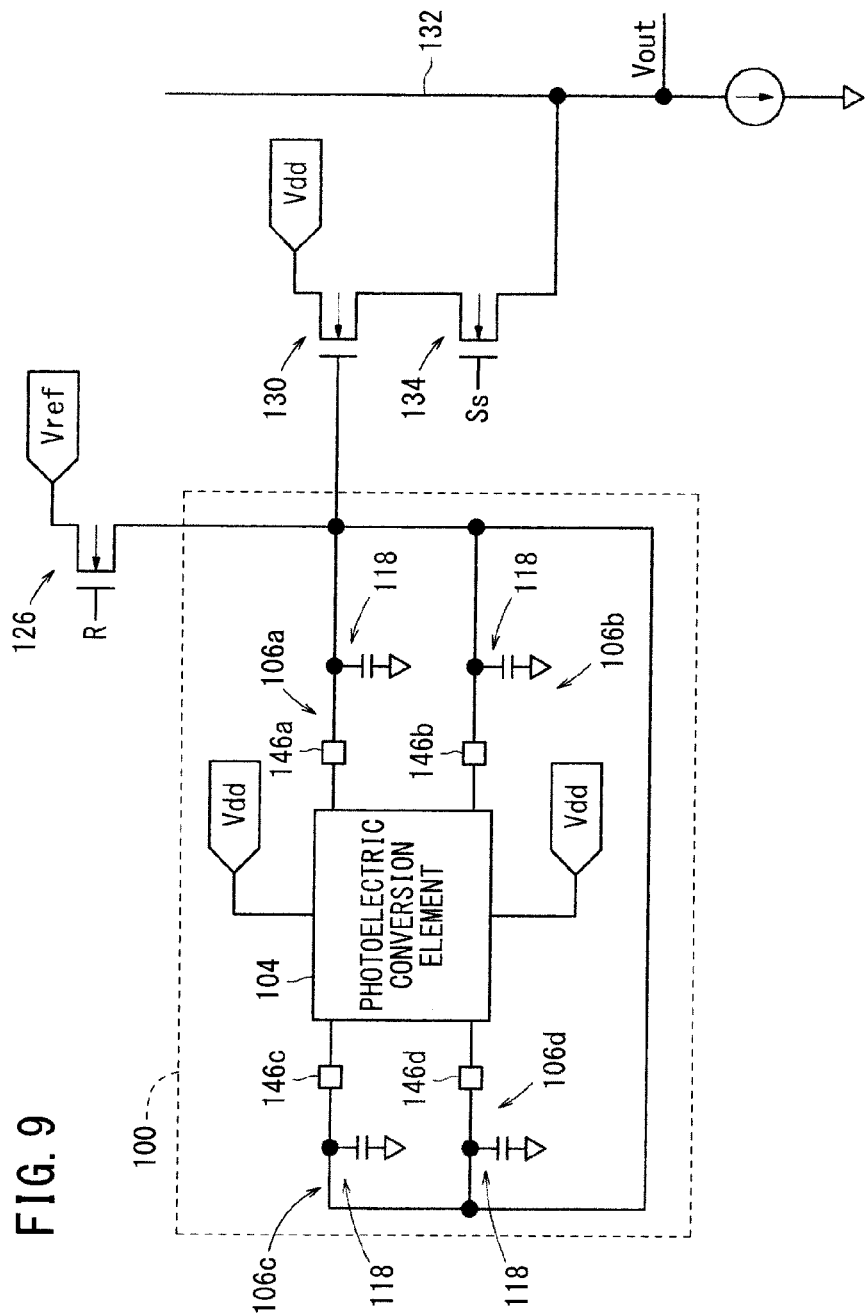
FIG. 9 is a view of a circuit structure of a light receiving device shown in FIG. 4.

FIG. 9 is a view of an example of the circuit structure of the light receiving device 100. The photoelectrons stored in the photoelectric conversion element 104 in the light receiving device 100 are transferred through transfer pathways 170a, 170b, 170c, and 170d to the floating diffusion layers 118 in the photoelectron distributors 106 (herein referred to as the photoelectron distributors 106a, 106b, 106c, and 106d for illustrative purposes). Each of the transfer pathways 146a, 146b, 146c, and 146d contains the first transfer unit 112, the photoelectron hold unit 114, and the second transfer unit 116 in each of the photoelectron distributors 106a, 106b, 106c, and 106d. The floating diffusion layers 118 in the photoelectron distributors 106a, 106b, 106c, and 106d are connected to the source of one reset transistor 126 and to the gate of the one signal read transistor 130.

Before the photoelectrons held in the photoelectron hold unit 114 are transferred to the floating diffusion layer 118 in each of the photoelectron distributors 106a, 106b, 106c, and 106d, the reset transistor 126 is turned on to reset the floating diffusion layer 118 at the reference potential, and the voltage of the floating diffusion layer 118 at the time (hereinafter referred to as the black level) is read from the signal read line 132. Then, the photoelectrons held in the photoelectron hold unit 114 are sequentially transferred to the floating diffusion layer 118. The photoelectrons transferred to the floating diffusion layer 118 are sequentially converted to a voltage signal (signal level) by the signal read transistor 130, and the voltage signal is read from the signal read line 132 through the selection transistor 134.

Specifically, the reset transistor 126 is turned on, whereby the potential of each floating diffusion layer 118 is reset to read out the black level, then the photoelectrons held in the photoelectron hold unit 114 are transferred to the floating diffusion layer 118 in the photoelectron distributor 106a, and the voltage signal (signal level) corresponding to the transferred photoelectrons is read from the signal read line 132. Next, the reset transistor 126 is turned on, whereby the potential of each floating diffusion layer 118 is reset to read out the black level, then the photoelectrons held in the photoelectron hold unit 114 are transferred to the floating diffusion layer 118 in the photoelectron distributor 106b, and the voltage signal (signal level) corresponding to the transferred photoelectrons is read from the signal read line 132. Furthermore, the reset transistor 126 is turned on, whereby the potential of each floating diffusion layer 118 is reset to read out the black level, then the photoelectrons held in the photoelectron hold unit 114 are transferred to the floating diffusion layer 118 in the photoelectron distributor 106c, and the voltage signal (signal level) corresponding to the transferred photoelectrons is read from the signal read line 132. Finally, the reset transistor 126 is turned on, whereby the potential of each floating diffusion layer 118 is reset to read out the black level, then the photoelectrons held in the photoelectron hold unit 114 are transferred to the floating diffusion layer 118 in the photoelectron distributor 106d, and the voltage signal (signal level) corresponding to the transferred photoelectrons is read from the signal read line 132.

All the voltage signals corresponding to the photoelectrons held in the photoelectron hold units 114 of the photoelectron distributors 106a, 106b, 106c, and 106d in the light receiving device 100 are read from the same signal read line 132 in this manner. It should be noted that the photoelectron dischargers 108 are omitted from FIG. 9.

Figure 10:
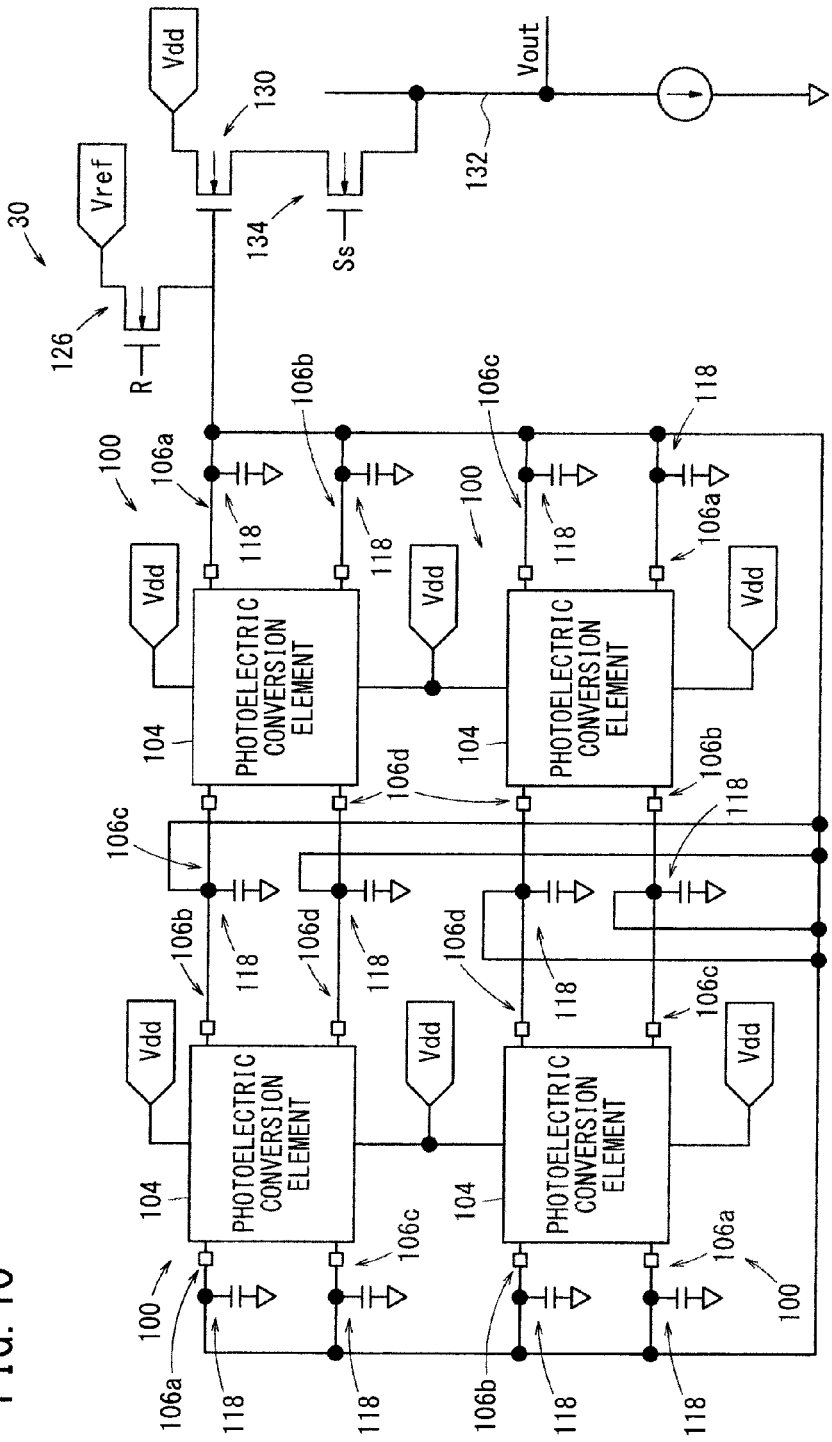
FIG. 10 is a circuit diagram of the unit pixel of FIG. 4 using the light receiving device of FIG. 9.

FIG. 10 is a circuit diagram of the unit pixel 30 of FIG. 4 using the light receiving device 100 of FIG. 9. The unit pixel 30 has the four light receiving devices 100, each of which has the one photoelectric conversion element 104, four photoelectron distributors 106a, 106b, 106c, and 106d, and two photoelectron dischargers 108, as shown in FIG. 9. The photoelectron dischargers 108 are omitted also in FIG. 10. In all the light receiving devices 100, the floating diffusion layers 118 of the photoelectron distributors 106a, 106b, 106c, and 106d are each connected to the source of the reset transistor 126 and the gate of the signal read transistor 130.

The reset transistor 126 is turned on, whereby the potential of each floating diffusion layer 118 in the photoelectron distributors 106a, 106b, 106c, and 106d is reset to read out the black level, then the photoelectrons held in the photoelectron hold unit 114 are transferred to the floating diffusion layer 118 in each photoelectron distributor 106a, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106a in the light receiving devices 100 of the unit pixel 30, is read from the signal read line 132.

Next, the reset transistor 126 is turned on, whereby the potential of each floating diffusion layer 118 in the photoelectron distributors 106a, 106b, 106c, and 106d is reset to read out the black level, then the photoelectrons held in the photoelectron hold unit 114 are transferred to the floating diffusion layer 118 in each photoelectron distributor 106b, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106b in the light receiving devices 100 of the unit pixel 30, is read from the signal read line 132.

Furthermore, the reset transistor 126 is turned on, whereby the potential of each floating diffusion layer 118 in the photoelectron distributors 106a, 106b, 106c, and 106d is reset to read out the black level, then the photoelectrons held in the photoelectron hold unit 114 are transferred to the floating diffusion layer 118 in each photoelectron distributor 106c, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106c in the light receiving devices 100 of the unit pixel 30, is read from the signal read line 132.

Finally, the reset transistor 126 is turned on, whereby the potential of each floating diffusion layer 118 in the photoelectron distributors 106a, 106b, 106c, and 106d is reset to read out the black level, then the photoelectrons held in the photoelectron hold unit 114 are transferred to the floating diffusion layer 118 in each photoelectron distributor 106d, and the voltage signal (signal level) corresponding to the transferred photoelectrons is read from the signal read line 132. Thus, a voltage signal corresponding to the total number of the photoelectrons, transferred to the floating diffusion layers 118 of the photoelectron distributors 106d in the light receiving devices 100 of the unit pixel 30, is read from the signal read line 132. All the voltage signals corresponding to the photoelectrons held in the photoelectron hold units 114 of the light receiving devices 100 in the unit pixel 30 are read from the same signal read line 132 in this manner.

As shown in FIG. 10, in the unit pixel 30, the photoelectron distributors 106a, 106b, 106c, and 106d in each light receiving device 100 have different transfer directions. For example, the photoelectron distributor 106a in the upper-right light receiving device 100 has an upper-right transfer direction, the photoelectron distributor 106a in the lower-right light receiving device 100 has a lower-right transfer direction, the photoelectron distributor 106a in the upper-left light receiving device 100 has an upper-left transfer direction, and the photoelectron distributor 106a in the lower-left light receiving device 100 has a lower-left transfer direction.

As shown in FIG. 10, the photoelectron distributors 106c and 106d in the upper-right light receiving device 100 and the photoelectron distributors 106b and 106d in the upper-left light receiving device 100 share the floating diffusion layers 118, and the photoelectron distributors 106d and 106b in the lower-right light receiving device 100 and the photoelectron distributors 106d and 106c in the lower-left light receiving device 100 share the floating diffusion layers 118.

Figure 11:
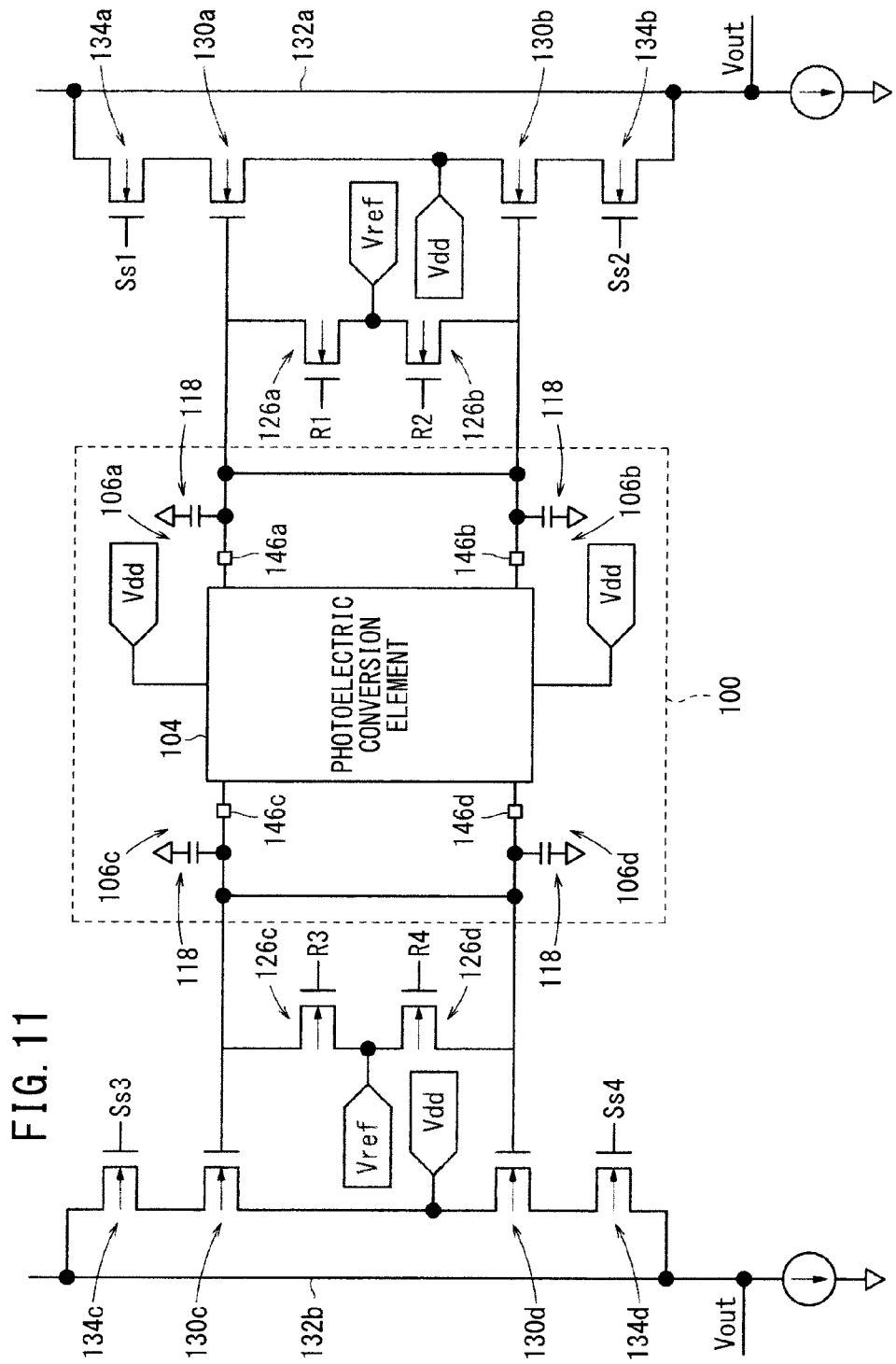
FIG. 11 is a view of another circuit structure of the unit pixel different from that of FIG. 9.

As shown in FIG. 11, the light receiving device 100 may have two signal read lines 132a and 132b. In this case, for example, the voltage signals corresponding to the photoelectrons transferred to the floating diffusion layers 118 in the photoelectron distributors 106a and 106b are read from the signal read line 132a, and the voltage signals corresponding to the photoelectrons transferred to the floating diffusion layers 118 in the photoelectron distributors 106c and 106d are read from the signal read line 132b. In the light receiving device 100 shown in FIG. 10, the sources of reset transistors 126a, 126b, 126c, and 126d are connected to the floating diffusion layers 118 of the photoelectron distributors 106a, 106b, 106c, and 106d, and the resetting voltage Vref is applied from the power source 20 to the drains. Furthermore, resetting signals R1, R2, R3, and R4 are supplied to the gates of the reset transistors 126a, 126b, 126c, and 126d. In addition, the gates of signal read transistors 130a, 130b, 130c, and 130d are connected to the floating diffusion layers 118 in the photoelectron distributors 106a, 106b, 106c, and 106d, and selection signals Ss1, Ss2, Ss3, and Ss4 are supplied to the gates of selection transistors 134a, 134b, 134c, and 134d. Thus, it is only necessary to connect the signal read line 132 with the floating diffusion layers 118 in the light receiving device 100.

The photoelectrons held in each photoelectron hold unit 114 in the light receiving device 100 shown in FIG. 11 may be read by using a separate signal read transistor 130 in this manner.

The light receiving device 100 has the four photoelectron distributors 106a, 106b, 106c, and 106d containing the photoelectron hold units 114 in this manner, so that the distance to the target object W can be obtained by the distance measuring system 10. Specifically, the photoelectrons generated in the photoelectric conversion element 104 in the former first light-receiving period are transferred to the photoelectron hold unit 114 in the photoelectron distributor 106a, the photoelectrons generated in the photoelectric conversion element 104 in the latter first light-receiving period are transferred to the photoelectron hold unit 114 in the photoelectron distributor 106b, the photoelectrons generated in the photoelectric conversion element 104 in the former second light-receiving period are transferred to the photoelectron hold unit 114 in the photoelectron distributor 106c, and the photoelectrons generated in the photoelectric conversion element 104 in the latter second light-receiving period are transferred to the photoelectron hold unit 114 in the photoelectron distributor 106d. As a result, the photoelectrons corresponding to $Q_{CB}$, $Q_{CA}$, $Q_B$, and $Q_A$ can be obtained. The distance to the target object W can be obtained by reading out the voltage signals corresponding to the photoelectrons from the floating diffusion layers 118 in the photoelectron distributors 106a, 106b, 106c, and 106d. The light-receiving process shown in FIG. 1 may be carried out multiple times (e.g. 100 times). At the end of each of the light-receiving periods (the former first light-receiving period, the latter first light-receiving period, the former second light-receiving period, and the latter second light-receiving period), the photoelectrons generated in the photoelectric conversion element 104 are allocated by the photoelectron distributors 106a, 106b, 106c, and 106d and sequentially held in the photoelectron hold units 114. After a plurality of the light-receiving periods expire, the photoelectrons held in the photoelectron hold units 114 in the photoelectron distributors 106a, 106b, 106c, and 106d are read out.

In FIG. 4, the arrows shown in the photoelectric conversion elements 104 in the light receiving devices 100 each represent a photoelectron transfer direction in one of the four light-receiving periods shown in FIG. 1. Specifically, the photoelectrons generated in the upper-left photoelectric conversion element 104 are transferred to the upper-left photoelectron distributor 106, the photoelectrons generated in the lower-left photoelectric conversion element 104 are transferred to the lower-left photoelectron distributor 106, the photoelectrons generated in the upper-right photoelectric conversion element 104 are transferred to the upper-right photoelectron distributor 106, and the photoelectrons generated in the lower-right photoelectric conversion element 104 are transferred to the lower-right photoelectron distributor 106.

In this embodiment, the unit pixel 30 contains a plurality of the light receiving devices 100. The photoelectrons, which are allocated by the photoelectron distributors 106 in the different transfer directions in the light receiving devices 100 of the unit pixel 30, are summed up and output. Therefore, the variation in the number of the photoelectrons transferred in each allocation direction can be reduced without depending on the allocation directions.

Specifically, after the light-receiving and transfer processes are repeated multiple times, the photoelectrons in the photoelectron distributors 106 are transferred to the floating diffusion layers 118. Since the photoelectrons are vertically and horizontally transferred, once stored, and then transferred to the floating diffusion layers 118, the photoelectron transfer speeds between the photoelectric conversion elements 104 and the first transfer units 112 can be averaged in the vertical and horizontal directions. Thus, when the four photoelectric conversion elements 104 have the different vertical and horizontal transfer directions in each of the four light-receiving periods shown in FIG. 1, the photoelectron transfer speeds do not depends on the allocation directions in the unit pixel 30, and calculation processes can be accurately carried out in a latter signal processing.

In a case where the unit pixel 30 has only one light receiving device 100, the transfer speed may be lowered in one direction due to the production or crystal orientation of the light receiving device 100, and the photoelectron information (the voltage signal corresponding to the photoelectrons) cannot be accurately obtained in an allocation direction. The time for allocating the photoelectrons generated in the photoelectric conversion element 104 (the timings at which the gate drive signals Sb, Sc, and Sd are supplied to the first transfer unit 112, the photoelectron hold unit 114, and the second transfer unit 116) is predetermined. Thus, when the photoelectrons are transferred in the allocation direction at the lowered transfer speed, it is impossible to transfer all the photoelectrons generated in the photoelectric conversion element 104.

In this embodiment, the light receiving device 100 in the unit pixel 30 has the photoelectron distributors 106 each containing the first transfer unit 112 for transferring the photoelectrons generated in the photoelectric conversion element 104, the photoelectron hold unit 114 for temporarily storing the photoelectrons, the second transfer unit 116 for transferring the photoelectrons stored in the photoelectron hold unit 114, and the floating diffusion layer 118 for storing the transferred photoelectrons and converting them to the voltage. Therefore, the photoelectrons generated in the photoelectric conversion element can be distributed in a plurality of directions and then read out, and the reset noise can be accurately removed.

The photoelectrons, which are generated in the photoelectric conversion element 104 and allocated by the photoelectron distributor 106, are held in the photoelectron hold unit 114. In the process of reading out the photoelectrons held in the photoelectron hold unit 114, first the potential of the floating diffusion layer 118 in the photoelectron distributor 106 is reset to read out the black level, then the photoelectrons held in the photoelectron hold unit 114 are transferred to the floating diffusion layer 118, and the voltage signal corresponding to the photoelectrons is read out. Therefore, the gap between the reset timing and the read timing for the potential of the floating diffusion layer 118 can be minimized. Thus, the black level can be accurately obtained, and the reset noise can be accurately removed.

The unit pixel 30 contains a plurality of the light receiving devices 100. Therefore, the variation in the number of the photoelectrons transferred in each allocation direction, which depends on the variation in the transfer speed due to the production or crystal orientation of the light receiving device 100, can be reduced to improve the receiving accuracy. Furthermore, since the light receiving devices 100 in the unit pixel 30 share at least part of the floating diffusion layers 118, the unit pixel can be miniaturized and the chip area can be reduced, whereby the costs for the unit pixel 30 can be reduced and the resolution of the unit pixels 30 can be increased.

The unit pixel 30 has the four light receiving devices 100 arranged in a matrix, each light receiving device 100 has the four photoelectron distributors 106, each two of the four photoelectron distributors 106 are arranged in the horizontal direction symmetrically with respect to the photoelectric conversion element 104, and the light receiving devices 100 adjacent to each other in the horizontal direction share the floating diffusion layers 118 formed therebetween. As a result, the unit pixel 30 can be miniaturized and the chip area can be reduced, whereby the costs for the unit pixel 30 can be reduced and the resolution of the unit pixels 30 can be increased.

The solid-state image sensing device 28, which contains the pixel array 32 containing the unit pixels 30 arranged one- or two-dimensionally, has the signal read transistor 130 for reading out the potentials of the floating diffusion layers 118 and the signal read line 132 for reading out the signals from the signal read transistor 130. The potentials of the floating diffusion layers 118 in the unit pixel 30 are read from the one signal read transistor 130. Therefore, a signal read circuit can be shared, the output variation due to the production of circuits can be reduced, and the solid-state image sensing device 28 can be miniaturized to increase the resolution.

When the former and latter first light-receiving periods (in which only the ambient light is received) and the former and latter second light-receiving periods (in which the ambient light and the reflected light are received) have the same light-receiving time length to obtain the distance to the target object W, the received light amount in the former first light-receiving period is equal to that in the latter first light-receiving period. Therefore, the light-receiving process may include only one of the first light-receiving periods in which only the ambient light is received. In this case, $Q_A$ may be considered to be equal to $Q_{CB}$ to obtain the distance to the object. Thus, the unit pixel 30 may have a structure shown in FIG. 12.

Figure 12:
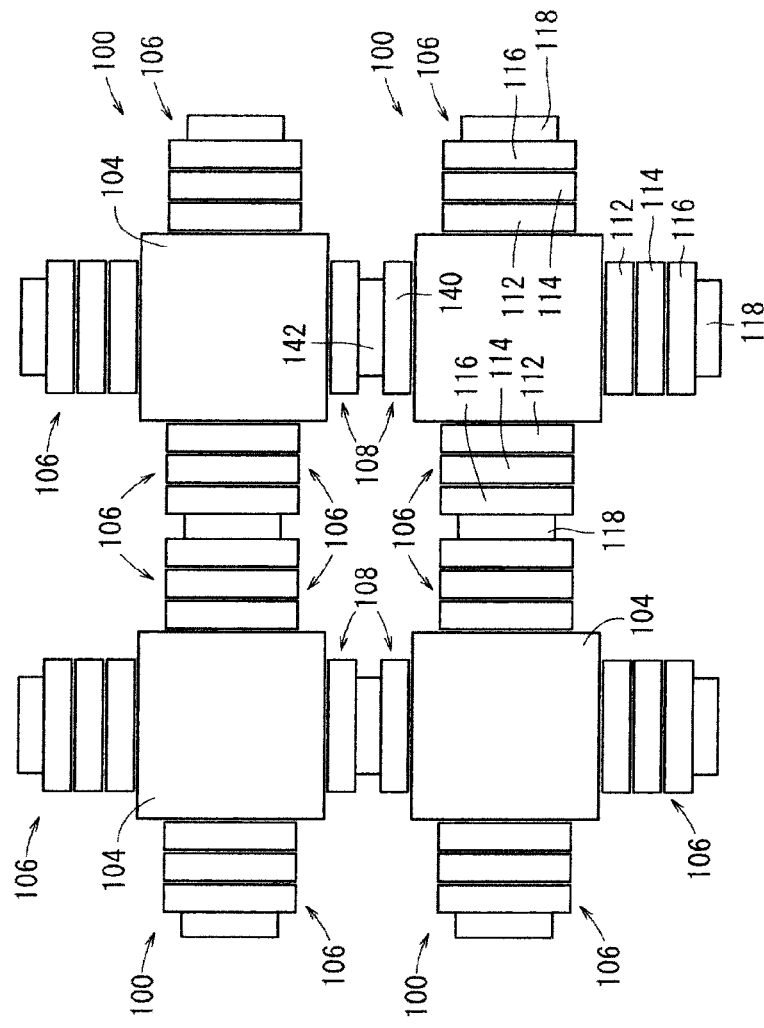
FIG. 12 is a plan view of another unit pixel different from that of FIG. 4.

FIG. 12 is a plan view of another unit pixel 30 different from that of FIG. 4. The same components are marked with the same numerals in FIGS. 4 and 12. The unit pixel 30 has four light receiving devices 100 arranged in a matrix. The light receiving device 100 has one photoelectric conversion element 104, three photoelectron distributors 106, and one photoelectron discharger 108. Two of the three photoelectron distributors 106 are arranged in the horizontal direction symmetrically with respect to the photoelectric conversion element 104, and the other one is formed on the top or bottom of the photoelectric conversion element 104. The photoelectron discharger 108 is formed on the bottom or top of the photoelectric conversion element 104, on which the photoelectron distributor 106 is not formed. In the two upper light receiving devices 100 in the unit pixel 30, the photoelectron distributor 106 is formed on the top of the photoelectric conversion element 104, and the photoelectron discharger 108 is formed on the bottom. In the two lower light receiving devices 100 in the unit pixel 30, the photoelectron distributor 106 is formed on the bottom of the photoelectric conversion element 104, and the photoelectron discharger 108 is formed on the top. In the structure of the unit pixel 30, the light receiving devices 100 adjacent to each other in the vertical direction share a diffusion layer 142 formed therebetween. Furthermore, in the unit pixel 30, the light receiving devices 100 adjacent to each other in the horizontal direction share a floating diffusion layer 118 formed therebetween.

Thus, the unit pixel 30 has the four light receiving devices 100 arranged in a matrix, the light receiving device 100 has the three photoelectron distributors 106, two of the three photoelectron distributors 106 are arranged in the horizontal direction symmetrically with respect to the photoelectric conversion element 104, the other photoelectron distributor 106 is formed on the top or bottom of the photoelectric conversion element 104, and the light receiving devices 100 adjacent to each other in the horizontal direction share the floating diffusion layer 118 formed therebetween. Therefore, the unit pixel 30 can be miniaturized and the chip area can be reduced, whereby the costs for the unit pixel 30 can be reduced and the resolution of the unit pixels 30 can be increased.

The above embodiment may be modified as follows.

MODIFIED EXAMPLE 1

Figure 13:
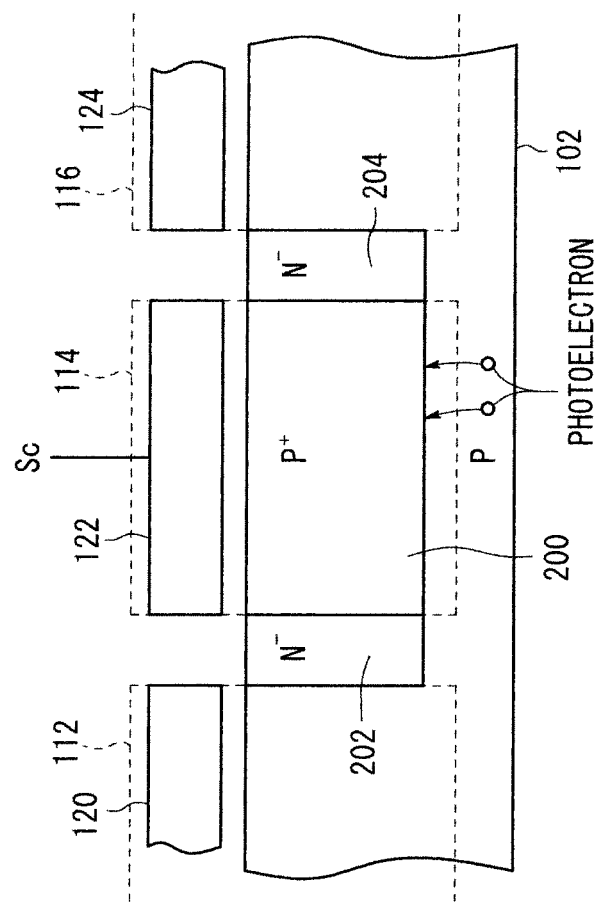
FIG. 13 is an enlarged view of a main part of a cross-section taken along the line V-V in the direction of the arrows in FIG. 4 according to Modified Example 1.

FIG. 13 is an enlarged view of a main part of a cross-section taken along the line V-V in the direction of the arrows in FIG. 4 according to Modified Example 1. In the photoelectron hold unit 114, a p-type impurity region 200 is formed in a surface (having the hold gate 122) of the p-type semiconductor substrate 102. The p-type impurity region 200 has a first p-type impurity concentration higher than the p-type impurity concentration of the p-type semiconductor substrate 102. In this structure, an electric field is generated in the photoelectron hold unit 114 by a built-in potential due to the concentration difference, to prevent the photoelectrons deep inside the p-type semiconductor substrate 102 from being thermally diffused toward the photoelectron hold unit 114. Thus, the photoelectrons deep inside the p-type semiconductor substrate 102 can be prevented from being introduced into the photoelectron hold unit 114 by the thermal diffusion, whereby the light-receiving accuracy and the distance measuring accuracy can be improved. In addition, since the p-type impurity region 200 having the first concentration higher than the p-type impurity concentration of the p-type semiconductor substrate 102 is formed in the surface of the p-type semiconductor substrate 102, a depletion layer does not extend deep inside the p-type semiconductor substrate 102 even when the high gate signal Sc is supplied to the hold gate 122.

Consequently, it is possible to prevent the penetration of the photoelectrons generated in the photoelectric conversion element 104 into the photoelectron hold unit 114 without passing through the first transfer unit 112.

In addition, n-type (second-conductivity-type) impurity regions 202 and 204 are formed on the p-type impurity region 200 between the first transfer gate 120 of the first transfer unit 112 and the hold gate 122 of the photoelectron hold unit 114 and between the hold gate 122 of the photoelectron hold unit 114 and the second transfer gate 124 of the second transfer unit 116. Therefore, the potential levels between the first transfer gate 120 of the first transfer unit 112 and the hold gate 122 of the photoelectron hold unit 114 and between the hold gate 122 of the photoelectron hold unit 114 and the second transfer gate 124 of the second transfer unit 116 are lowered to improve the photoelectron transfer speed from the photoelectric conversion element 104 to the photoelectron hold unit 114 and the photoelectron transfer speed from the photoelectron hold unit 114 to the floating diffusion layer 118.

MODIFIED EXAMPLE 2

Figure 14:
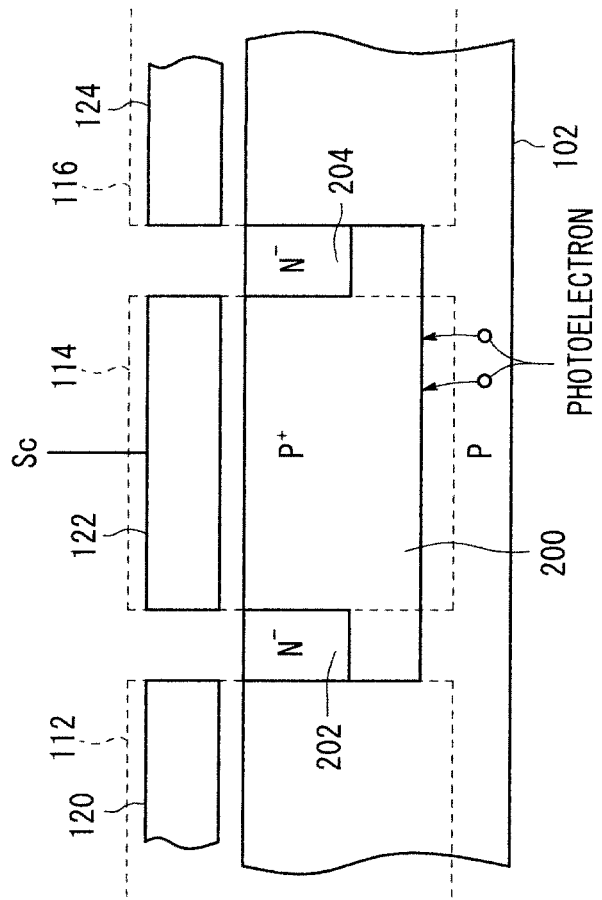
FIG. 14 is an enlarged view of a main part of the cross-section taken along the line V-V in the direction of the arrows in FIG. 4 according to Modified Example 2.

FIG. 14 is an enlarged view of a main part of the cross-section taken along the line V-V in the direction of the arrows in FIG. 4 according to Modified Example 2. Modified Example 2 is approximately the same as Modified Example 1 except that the p-type impurity region 200 extends in the depth direction of the p-type semiconductor substrate 102 more than the n-type impurity regions 202 and 204. Specifically, the p-type impurity region 200 extends in the depth direction more than the n-type impurity region 202 (formed between the first transfer gate 120 of the first transfer unit 112 and the hold gate 122 of the photoelectron hold unit 114) and the n-type impurity region 204 (formed between the hold gate 122 of the photoelectron hold unit 114 and the second transfer gate 124 of the second transfer unit 116), and further extends below the n-type impurity regions 202 and 204. Also in this structure, the advantageous effects of Modified Example 1 can be achieved.

MODIFIED EXAMPLE 3

Figure 15:
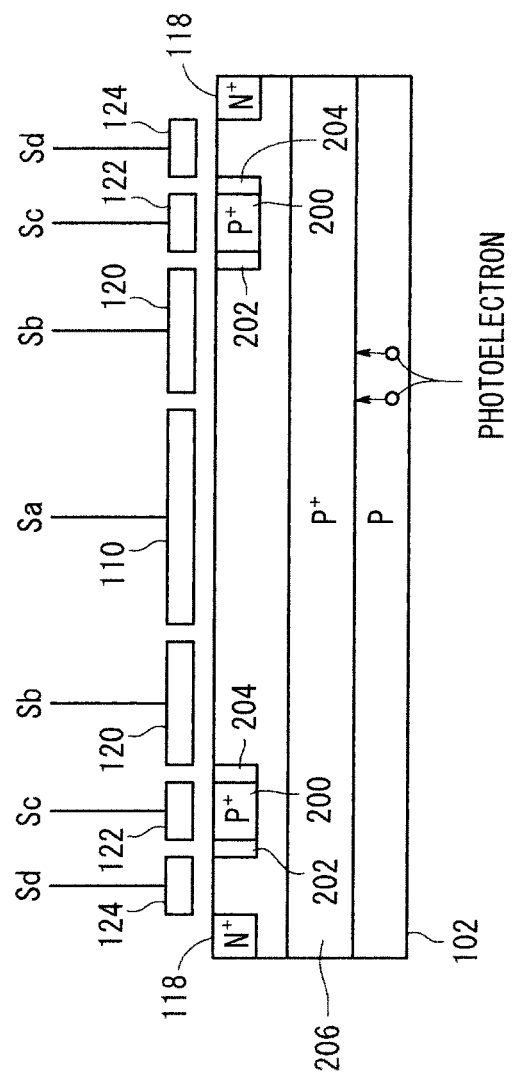
FIG. 15 is a cross-sectional view taken along the line V-V in the direction of the arrows in FIG. 4 according to Modified Example 3.

FIG. 15 is a cross-sectional view taken along the line V-V in the direction of the arrows in FIG. 4 according to Modified Example 3. In Modified Example 3, a p-type impurity layer 206 is formed as an intermediate layer in the p-type semiconductor substrate 102 of Modified Example 1 or 2. The p-type impurity layer 206 has a second p-type impurity concentration higher than the p-type impurity concentration of the p-type semiconductor substrate 102. In this structure, an electric field is generated in the p-type semiconductor substrate 102 by a built-in potential due to the concentration difference, to prevent the photoelectrons deep inside the p-type semiconductor substrate 102 from being thermally diffused toward the surface of the p-type semiconductor substrate 102. Thus, the photoelectrons deep inside the p-type semiconductor substrate 102 can be prevented from being introduced into the surface of the p-type semiconductor substrate 102 (the photoelectron hold unit 114, the first transfer unit 112, the photoelectron hold unit 114, the second transfer unit 116, and the floating diffusion layer 118) by the thermal diffusion, whereby the light-receiving accuracy and the distance measuring accuracy can be improved.

More specifically, it is possible to prevent the penetration of the photoelectrons generated deep inside the p-type semiconductor substrate 102 in periods other than the light-receiving periods.

MODIFIED EXAMPLE 4

Figure 16:
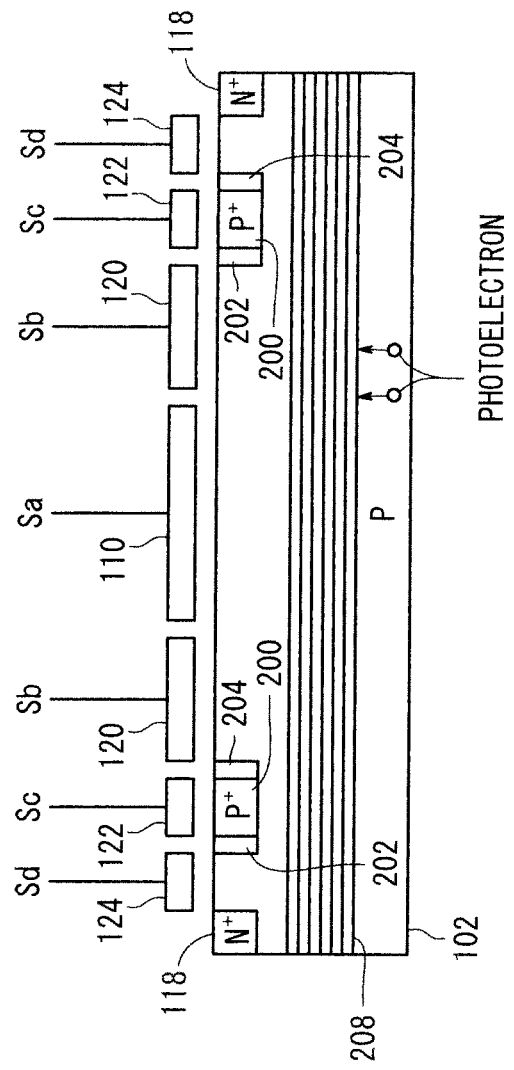
FIG. 16 is a cross-sectional view taken along the line V-V in the direction of the arrows in FIG. 4 according to Modified Example 4.

FIG. 16 is a cross-sectional view taken along the line V-V in the direction of the arrows in FIG. 4 according to Modified Example 4. Modified Example 4 is approximately the same as Modified Example 3 except for forming a p-type impurity layer 208 instead of the p-type impurity layer 206. The p-type impurity layer 208 has a third p-type impurity concentration different from the p-type impurity concentration of the p-type semiconductor substrate 102. The p-type impurity concentration of the p-type impurity layer 208 decreases in a direction toward the surface of the p-type semiconductor substrate 102. Specifically, the p-type impurity layer 208 contains a plurality of layers, and the layer closer to the surface of the p-type semiconductor substrate 102 has a lower p-type impurity concentration. Among the layers of the p-type impurity layer 208, the layer farthest from the surface of the p-type semiconductor substrate 102 (the layer closest to the back of the p-type semiconductor substrate 102) has a p-type impurity concentration higher than that of the p-type semiconductor substrate 102. In this structure, the potential level decreases in the direction toward the surface of the p-type semiconductor substrate 102. Therefore, the advantageous effects of Modified Example 3 can be achieved, and furthermore the photoelectrons in an area between the intermediate layer and the surface of the p-type semiconductor substrate 102 can be readily collected in the surface of the p-type semiconductor substrate 102 (the photoelectric conversion element 104, the photoelectron hold unit 114, and the floating diffusion layer 118).

Consequently, the photoelectrons generated in the area between the intermediate layer and the surface of the p-type semiconductor substrate 102 in the light-receiving periods can be readily collected in the surface of the p-type semiconductor substrate 102, and it is possible to prevent the penetration of the residual photoelectrons generated deep inside the p-type semiconductor substrate 102 in periods other than the light-receiving periods.

MODIFIED EXAMPLE 5

Figure 17:
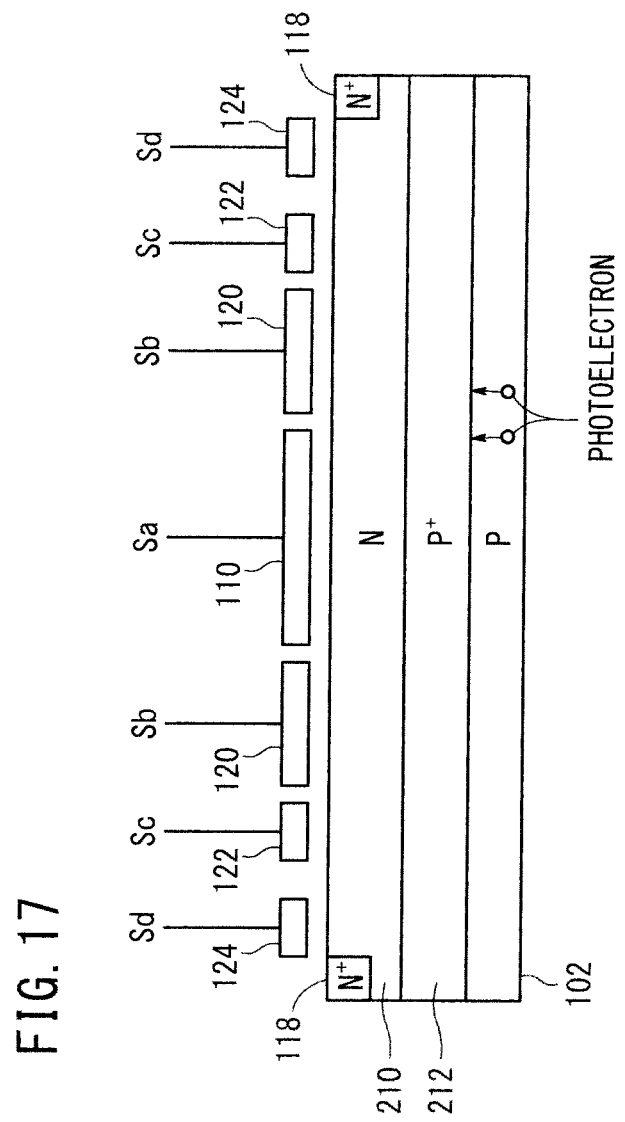
FIG. 17 is a cross-sectional view taken along the line V-V in the direction of the arrows in FIG. 4 according to Modified Example 5.

FIG. 17 is a cross-sectional view taken along the line V-V in the direction of the arrows in FIG. 4 according to Modified Example 5. In Modified Example 5, an n-type impurity region 210 is formed in the surface (having the photogate 110 and the like) of the p-type semiconductor substrate 102, and a p-type impurity layer 212 is formed as the intermediate layer of the p-type semiconductor substrate 102. The p-type impurity layer 212 has a fourth p-type impurity concentration higher than the p-type impurity concentration of the p-type semiconductor substrate 102.

In this structure, an electric field is generated in the p-type semiconductor substrate 102 by a built-in potential due to the concentration difference, to prevent the photoelectrons deep inside the p-type semiconductor substrate 102 from being thermally diffused toward the substrate surface. Thus, the photoelectrons deep inside the p-type semiconductor substrate 102 can be prevented from being introduced into the surface of the p-type semiconductor substrate 102 (the photoelectron hold unit 114, the first transfer unit 112, the photoelectron hold unit 114, the second transfer unit 116, and the floating diffusion layer 118) by the thermal diffusion, whereby the light-receiving accuracy and the distance measuring accuracy can be improved. In addition, since the p-type impurity layer 212 having the fourth concentration higher than the p-type impurity concentration of the p-type semiconductor substrate 102 is formed as the intermediate layer, a depletion layer does not extend deep inside the p-type semiconductor substrate 102 even when the high gate signal Sc is supplied to the hold gate 122.

Furthermore, when the n-type impurity region 210 is formed in the surface of the p-type semiconductor substrate 102, the photoelectrons can be stored inside the p-type semiconductor substrate 102, the generation of the photoelectrons unusable as a signal can be prevented, and the noise generation probability can be reduced. It should be noted that the n-type impurity concentration of the n-type impurity region 210 is lower than that of the floating diffusion layer 118.

MODIFIED EXAMPLE 6

Figure 18:
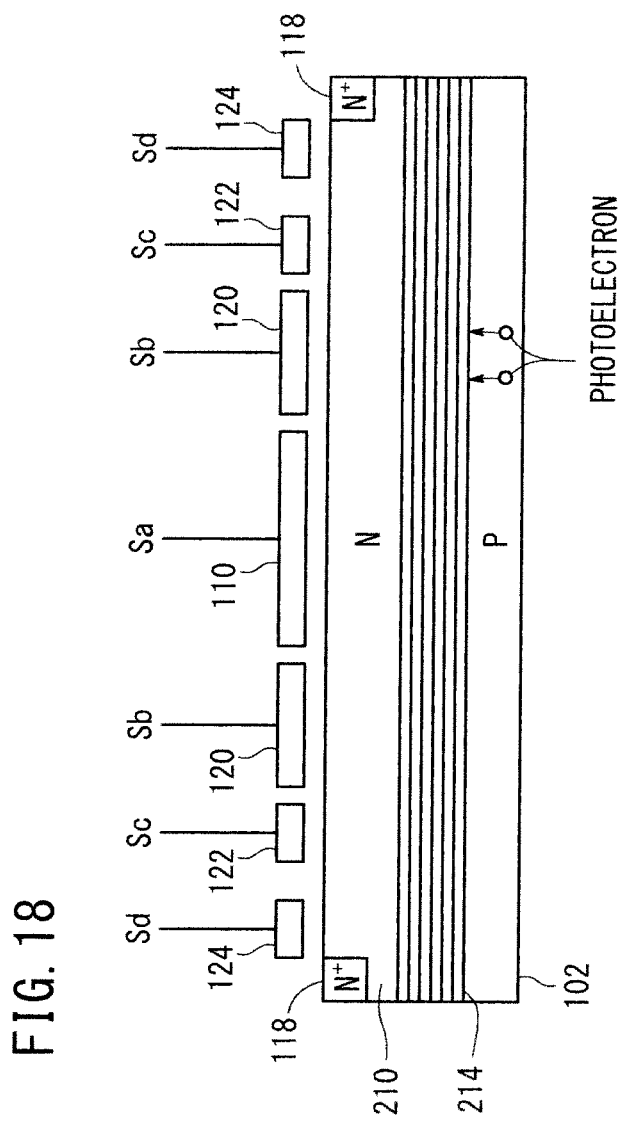
FIG. 18 is a cross-sectional view taken along the line V-V in the direction of the arrows in FIG. 4 according to Modified Example 6.

FIG. 18 is a cross-sectional view taken along the line V-V in the direction of the arrows in FIG. 4 according to Modified Example 6. Modified Example 6 is approximately the same as Modified Example 5 except for forming a p-type impurity layer 214 instead of the p-type impurity layer 212. The p-type impurity layer 214 has a fifth p-type impurity concentration different from the p-type impurity concentration of the p-type semiconductor substrate 102. The p-type impurity concentration of the p-type impurity layer 214 decreases in the direction toward the surface of the p-type semiconductor substrate 102. Specifically, the p-type impurity layer 214 contains a plurality of layers, and the layer closer to the surface of the p-type semiconductor substrate 102 has a lower p-type impurity concentration. Among the layers of the p-type impurity layer 214, the layer farthest from the surface of the p-type semiconductor substrate 102 has a p-type impurity concentration higher than that of the p-type semiconductor substrate 102. In this structure, the potential level decreases in the direction toward the surface of the p-type semiconductor substrate 102. Therefore, the advantageous effects of Modified Example 5 can be achieved, and furthermore the photoelectrons in the area between the intermediate layer and the substrate surface can be readily collected in the surface of the p-type semiconductor substrate 102 (the photoelectric conversion element 104, the photoelectron hold unit 114, and the floating diffusion layer 118).

MODIFIED EXAMPLE 7

Though the unit pixel 30 has the four light receiving devices 100 in the above embodiment, the unit pixel 30 may have two, three, five, or more light receiving devices 100. Alternatively, the unit pixel 30 may have only one light receiving device 100. Though the light receiving device 100 has the three or four photoelectron distributors 106 in the above embodiment, the light receiving device 100 may have five or more photoelectron distributors 106. Furthermore, though the solid-state image sensing device 28, the unit pixel 30, and the light receiving device 100 are applied to the distance measuring system in the above embodiment, they can be applied to another apparatus or system such as a compact digital camera, a video camera, a monitoring camera, or a monitoring system.

Although the present invention has been described with reference to the above embodiment, the scope of the invention is not limited to the embodiment. It will be apparent to those skilled in the art that various changes and modifications may be made to the embodiment without departing from the scope of the invention as set forth in the appended claims.

What is claimed is:

1. A light receiving device comprising a photoelectric conversion element for detecting a light to generate photoelectrons formed on a first-conductivity-type semiconductor substrate, wherein the light receiving device further comprises a plurality of photoelectron distributors formed on the first-conductivity-type semiconductor substrate, each of the photoelectron distributors has a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, and a floating diffusion layer located on one side of the photoelectron hold unit with the second transfer unit interposed therebetween for converting the transferred photoelectrons to a voltage, and a first-conductivity-type impurity region is formed so as to confront a hold gate of the photoelectron hold unit in the vicinity of a surface of the first-conductivity-type semiconductor substrate in the photoelectron hold unit and has a first-level, first-conductivity-type impurity concentration higher than the first-conductivity-type impurity concentration of the first-conductivity-type semiconductor substrate.

2. The light receiving device according to claim 1, wherein a second-conductivity-type impurity region is formed adjacent to the first-conductivity-type impurity region between a first transfer gate of the first transfer unit and the hold gate of the photoelectron hold unit and/or between the hold gate of the photoelectron hold unit and a second transfer gate of the second transfer unit in the vicinity of the surface of the first-conductivity-type semiconductor substrate.

3. The light receiving device according to claim 2, wherein the first-conductivity-type impurity region extends in a depth direction more than the second-conductivity-type impurity region formed between the first transfer gate of the first transfer unit and the hold gate of the photoelectron hold unit and/or between the hold gate of the photoelectron hold unit and the second transfer gate of the second transfer unit, and further extends beneath the second-conductivity-type impurity region.

4. The light receiving device according to claim 1, wherein a first-conductivity-type impurity layer is formed as an intermediate layer in the first-conductivity-type semiconductor substrate and has a second-level, first-conductivity-type impurity concentration higher than the first-conductivity-type impurity concentration of the first-conductivity-type semiconductor substrate.

5. The light receiving device according to claim 1, wherein
a first-conductivity-type impurity layer is formed as an intermediate layer in the first-conductivity-type semiconductor substrate, and has a third-level, first-conductivity-type impurity concentration different from the first-conductivity-type impurity concentration of the first-conductivity-type semiconductor substrate, and
the first-conductivity-type impurity concentration of the first-conductivity-type impurity layer decreases in a direction toward the surface of the first-conductivity-type semiconductor substrate.

6. A light receiving device comprising a photoelectric conversion element for detecting a light to generate photoelectrons formed on a first-conductivity-type semiconductor substrate, wherein the light receiving device further comprises a plurality of photoelectron distributors formed on the first-conductivity-type semiconductor substrate, each of the photoelectron distributors has a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, and a floating diffusion layer located on one side of the photoelectron hold unit with the second transfer unit interposed therebetween for storing the transferred photoelectrons and converting the photoelectrons to a voltage, a second-conductivity-type impurity region is formed in the vicinity of a surface of the first-conductivity-type semiconductor substrate, and a first-conductivity-type impurity layer is formed as an intermediate layer in the first-conductivity-type semiconductor substrate below respective gates of the photoelectric conversion element, the first transfer unit, the photoelectron hold unit, and the second transfer unit, and the first-conductivity-type impurity layer has a fourth-level, first-conductivity-type impurity concentration higher than the first-conductivity-type impurity concentration of the first-conductivity-type semiconductor substrate.

7. A light receiving device comprising a photoelectric conversion element for detecting a light to generate photoelectrons formed on a first-conductivity-type semiconductor substrate, wherein the light receiving device further comprises a plurality of photoelectron distributors formed on the first-conductivity-type semiconductor substrate, each of the photoelectron distributors has a first transfer unit for transferring the photoelectrons generated in the photoelectric conversion element, a photoelectron hold unit located on one side of the photoelectric conversion element with the first transfer unit interposed therebetween for temporarily holding the photoelectrons generated in the photoelectric conversion element, a second transfer unit located on one side of the first transfer unit with the photoelectron hold unit interposed therebetween for transferring the photoelectrons held in the photoelectron hold unit, and a floating diffusion layer located on one side of the photoelectron hold unit with the second transfer unit interposed therebetween for converting the transferred photoelectrons to a voltage, a second-conductivity-type impurity region is formed in the vicinity of a surface of the first-conductivity-type semiconductor substrate, a first-conductivity-type impurity layer is formed as an intermediate layer in the first-conductivity-type semiconductor substrate below respective gates of the photoelectric conversion element, the first transfer unit, the photoelectron hold unit, and the second transfer unit, the first-conductivity-type impurity layer has a fifth-level, first-conductivity-type impurity concentration different from the first-conductivity-type impurity concentration of the first-conductivity-type semiconductor substrate, and the first-conductivity-type impurity concentration of the first-conductivity-type impurity layer decreases in a direction toward the surface of the first-conductivity-type semiconductor substrate.

8. The light receiving device according to claim 1, wherein the photoelectric conversion element has a photogate structure, and the first transfer unit, the photoelectron hold unit, and the second transfer unit have an MOS diode structure.

* * * * *